(12) United States Patent
Sun et al.

(10) Patent No.: US 9,973,121 B2
(45) Date of Patent: May 15, 2018

(54) MAGNETIC SENSOR AND AN INTEGRATED CIRCUIT

(71) Applicant: Johnson Electric S.A., Murten (CH)

(72) Inventors: Chi Ping Sun, Hong Kong (CN); Fei Xin, Shen Zhen (CN); Ken Wong, Hong Kong (CN); Shing Hin Yeung, Hong Kong (CN); Hui Min Guo, Hong Kong (CN); Shu Zuo Lou, Hong Kong (CN); Xiao Ming Chen, Hong Kong (CN); Guang Jie Cai, Hong Kong (CN); Chun Fai Wong, Hong Kong (CN); Shu Juan Huang, Shen Zhen (CN); Yun Long Jiang, Shen Zhen (CN); Yue Li, Hong Kong (CN); Bao Ting Liu, Shen Zhen (CN); En Hui Wang, Shen Zhen (CN); Xiu Wen Yang, Shen Zhen (CN); Li Sheng Liu, Shen Zhen (CN); Yan Yun Cui, Shen Zhen (CN)

(73) Assignee: JOHNSON ELECTRIC S.A., Murten (CH)

( * ) Notice: Subject to any disclaimer, the term of this patent is extended or adjusted under 35 U.S.C. 154(b) by 0 days. days.

(21) Appl. No.: 15/230,941

(22) Filed: Aug. 8, 2016

(65) Prior Publication Data
US 2017/0005605 A1    Jan. 5, 2017

Related U.S. Application Data

(63) Continuation-in-part of application No. 14/822,353, filed on Aug. 10, 2015, now Pat. No. 9,755,555.

(30) Foreign Application Priority Data

Aug. 8, 2014 (CN) .......................... 2014 1 0390592
Aug. 15, 2014 (CN) .......................... 2014 1 0404474
(Continued)

(51) Int. Cl.
*G01R 15/14* (2006.01)
*G01R 33/02* (2006.01)
(Continued)

(52) U.S. Cl.
CPC ............... *H02P 6/16* (2013.01); *G01D 5/145* (2013.01); *G01R 33/07* (2013.01); *H02K 11/215* (2016.01);
(Continued)

(58) Field of Classification Search
CPC ............................... G01R 15/20; G01R 33/09
(Continued)

(56) References Cited

U.S. PATENT DOCUMENTS 5,675,226 A    10/1997  Riola
6,097,127 A *  8/2000   Rivera ..................... H02K 3/28
                                               310/156.12
(Continued)

FOREIGN PATENT DOCUMENTS

CN    201409107 Y    2/2010
CN    201590796 U    9/2010
(Continued)

OTHER PUBLICATIONS

International Search Report dated Oct. 19, 2015 in International Application No. PCT/CN2015/086422.

*Primary Examiner* — Eduardo Colon Santana
*Assistant Examiner* — Cortez Cook
(74) *Attorney, Agent, or Firm* — Pillsbury Winthrop Shaw Pittman LLP

(57) ABSTRACT

The present teaching relates to a magnetic sensor residing in a housing. The magnetic sensor includes an input port and an output port, both extending from the housing, wherein the input port is to be connected to an external alternating current (AC) power supply. The magnetic sensor also includes an electric circuit which comprises an output control circuit coupled with the output port and configured to be at least responsive to a magnetic induction signal and the external AC power supply to control the magnetic sensor to operate in a state in which a load current flows through the output port. The magnetic induction signal is indicative of at least one characteristic of an external magnetic field detected by the electrical circuit and the operating frequency of the magnetic sensor is positively proportional to the frequency of the external AC power supply.

11 Claims, 24 Drawing Sheets

(30) Foreign Application Priority Data

| | | |
|---|---|---|
| Aug. 7, 2015 | (CN) | PCT/CN2015/086422 |
| Apr. 1, 2016 | (CN) | 2016 1 0203682 |
| Jun. 2, 2016 | (CN) | 2016 1 0392501 |

(51) Int. Cl.

| | |
|---|---|
| *G01N 33/20* | (2006.01) |
| *H02P 6/16* | (2016.01) |
| *H02P 6/20* | (2016.01) |
| *H02P 6/30* | (2016.01) |
| *H02K 11/215* | (2016.01) |
| *G01R 33/07* | (2006.01) |
| *G01D 5/14* | (2006.01) |
| *H02P 7/295* | (2016.01) |
| *H02P 7/03* | (2016.01) |

(52) U.S. Cl.
CPC .............. *H02P 6/20* (2013.01); *H02P 6/30* (2016.02); *H02P 7/05* (2016.02); *H02P 7/295* (2013.01); *H02P 2207/05* (2013.01)

(58) Field of Classification Search
USPC ............................................. 324/117 R, 252
See application file for complete search history.

(56) References Cited

U.S. PATENT DOCUMENTS

| | | | |
|---|---|---|---|
| 6,316,931 B1* | 11/2001 | Nakagawa | G01R 15/20 324/117 R |
| 2006/0132125 A1* | 6/2006 | Withanawasam | G01R 33/09 324/252 |

FOREIGN PATENT DOCUMENTS

| | | |
|---|---|---|
| CN | 102075130 A | 5/2011 |
| DE | 102006055482 | 6/2008 |

* cited by examiner

MAGNETIC SENSOR AND AN INTEGRATED CIRCUIT

CROSS REFERENCE TO RELATED APPLICATIONS

This non-provisional patent application is a continuation-in-part of U.S. patent application Ser. No. 14/822,353, which claims priority to Chinese Patent Application No. 201410390592.2, filed on Aug. 8, 2014 and to Chinese Patent Application No. 201410404474.2, filed on Aug. 15, 2014. In addition, this non-provisional patent application claims priority under the Paris Convention to PCT Patent Application No. PCT/CN2015/086422, filed with the Chinese Patent Office on Aug. 7, 2015, to Chinese Patent Application No. CN 201610203682.5, filed with the Chinese Patent Office on Apr. 1, 2016, and to Chinese Patent Application No. CN 201610392501.8, filed with the Chinese Patent Office on Jun. 2, 2016 all of which are incorporated herein by reference in their entirety.

BACKGROUND

1. Technical Field

The present teaching relates to a field of circuit technology. In particular, the present teaching relates to a magnetic sensor. The present teaching further relates to a driver for a low-power permanent magnetic motor.

2. Discussion of Technical Background

During starting of a synchronous motor, the stator produces an alternating magnetic field causing the permanent magnetic rotor to be oscillated. The amplitude of the oscillation of the rotor increases until the rotor begins to rotate, and finally the rotor is accelerated to rotate in synchronism with the alternating magnetic field of the stator. To ensure the starting of a conventional synchronous motor, a starting point of the motor is set to be low, which results in that the motor cannot operate at a relatively high working point, thus the efficiency is low. In another aspect, the rotor cannot be ensured to rotate in a same direction every time since a stop or stationary position of the permanent magnetic rotor is not fixed. Accordingly, in applications such as a fan and water pump, the impeller driven by the rotor has straight radial vanes, which results in a low operational efficiency of the fan and water pump.

FIG. 1 illustrates a conventional drive circuit for a synchronous motor, which allows a rotor to rotate in a same predetermined direction in every time it starts. In the circuit, a stator winding 1 of the motor is connected in series with a TRIAC between two terminals M and N of an AC power source VM, and an AC power source VM is converted by a conversion circuit DC into a direct current voltage and the direct current is supplied to a position sensor H. A magnetic pole position of a rotor in the motor is detected by the position sensor H, and an output signal Vh of the position sensor H is connected to a switch control circuit PC to control the bidirectional thyristor T.

FIG. 2 illustrates a waveform of the drive circuit. It can be seen from FIG. 2 that, in the drive circuit, no matter the bidirectional thyristor T is switched on or off, the AC power source supplies power for the conversion circuit DC so that the conversion circuit DC constantly outputs and supplies power for the position sensor H (referring to a signal VH in FIG. 2). In a low-power application, in a case that the AC power source is commercial electricity of about 200V, the electric energy consumed by two resistors R2 and R3 in the conversion circuit DC is more than the electric energy consumed by the motor.

The magnetic sensor applies Hall effect, in which, when current I runs through a substance and a magnetic field B is applied in a positive angle with respect to the current I, a potential difference V is generated in a direction perpendicular to the direction of current I and the direction of the magnetic field B. The magnetic sensor is often implemented to detect the magnetic polarity of an electric rotor.

As the circuit design and signal processing technology advances, there is a need to improve the magnetic sensor and the implemented IC for the ease of use and accurate detection.

SUMMARY

The present teaching provides a magnetic sensor and application(s) thereof. In one embodiment, the present teaching discloses a magnetic sensor that comprises a housing, an input and an output port, both extending from the housing, and an electrical circuit. The input port is connected to an external alternating current (AC) power supply. The electrical circuit includes an output control circuit coupled with the output port and configured to be at least responsive to a magnetic induction signal to control the magnetic sensor to operate in at least one of a first state and a second state. In the first state, a load current flows in a first direction from the output port to outside of the magnetic sensor. In the second state, a load current flows in a second direction opposite of the first direction from outside of the magnetic sensor into the magnetic sensor via the output port. The operating frequency of the magnetic sensor is positively proportional to the frequency of the external AC power supply.

In a different embodiment, the present teaching discloses a magnetic sensor that includes a housing, an input port extending from the housing and coupled with an external AC power supply, an output port extending from the housing, and an electrical circuit. The electrical circuit comprises an output control circuit coupled with the output port and configured to be at least responsive to a magnetic induction signal and the external AC power supply to control the magnetic sensor to operate in a state in which a load current flows through the output port. The magnetic induction signal is indicative of at least one characteristic of an external magnetic field detected by the electrical circuit and the operating frequency of the magnetic sensor is positively proportional to the frequency of the external AC power supply.

In another different embodiment, the present teaching discloses an integrated circuit, which includes an input port and an output port, wherein the input port is to be connected to an external AC power supply, and an electrical circuit. The electrical circuit comprises an output control circuit coupled with the output port and configured to be at least responsive to a detected signal to control the integrated circuit to operate in at least one of a first and a second state. In the first state, a load current flows in a first direction from the output port to outside of the integrated circuit. In the second state, a load current flows in a second direction opposite of the first direction from outside of the integrated circuit into the integrated circuit via the output port. The operating frequency of the integrated circuit is positively proportional to the frequency of the external AC power supply.

In yet another embodiment, the present teaching discloses a motor assembly, which comprises a motor configured to operate based on an AC power supply, a magnetic sensor configured to detect a magnetic field generated by the motor and operate in an operating state determined based on the detected magnetic field, and a bi-directional AC switch serially coupled with the motor and configured to control the motor based on the operating state of the magnetic sensor. The magnetic sensor includes an input port and an output port, wherein the input port is coupled with the external AC power supply and the output port is coupled with a control terminal of the bi-directional AC switch and an electrical circuit which comprises an output control circuit configured to be at least responsive to a magnetic induction signal, indicative of at least one characteristic of the magnetic field, to control the magnetic sensor to operate in at least one of a first state and a second state. In operation, in the first state, a load current flows in a first direction from the output port to the bi-directional AC switch. In the second state, a load current flows in a second direction opposite of the first direction from the bi-directional AC switch to the magnetic sensor via the output port. The operating frequency of the magnetic sensor is positively proportional to the frequency of the external AC power supply.

BRIEF DESCRIPTION OF THE DRAWINGS

The methods, systems, and/or programming described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, systems, components, and/or circuitry have been described at a relatively high-level, without detail, in order to avoid unnecessarily obscuring aspects of the present teachings.

Throughout the specification and claims, terms may have nuanced meanings suggested or implied in context beyond an explicitly stated meaning. Likewise, the phrase "in one embodiment/example" as used herein does not necessarily refer to the same embodiment and the phrase "in another embodiment/example" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Figure 1:
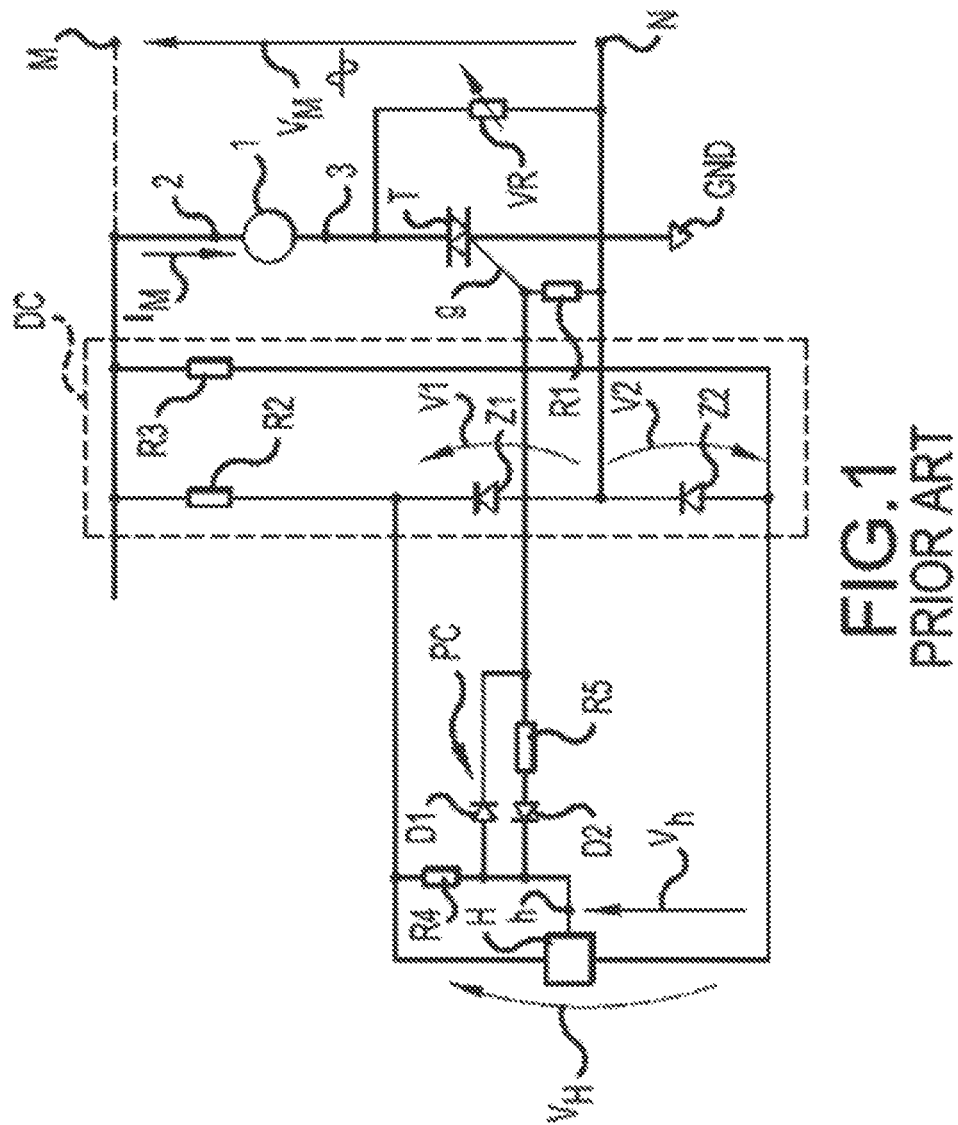
FIG. 1 illustrates a prior art drive circuit for a synchronous motor, according to an embodiment of the present teaching.
Figure 2:
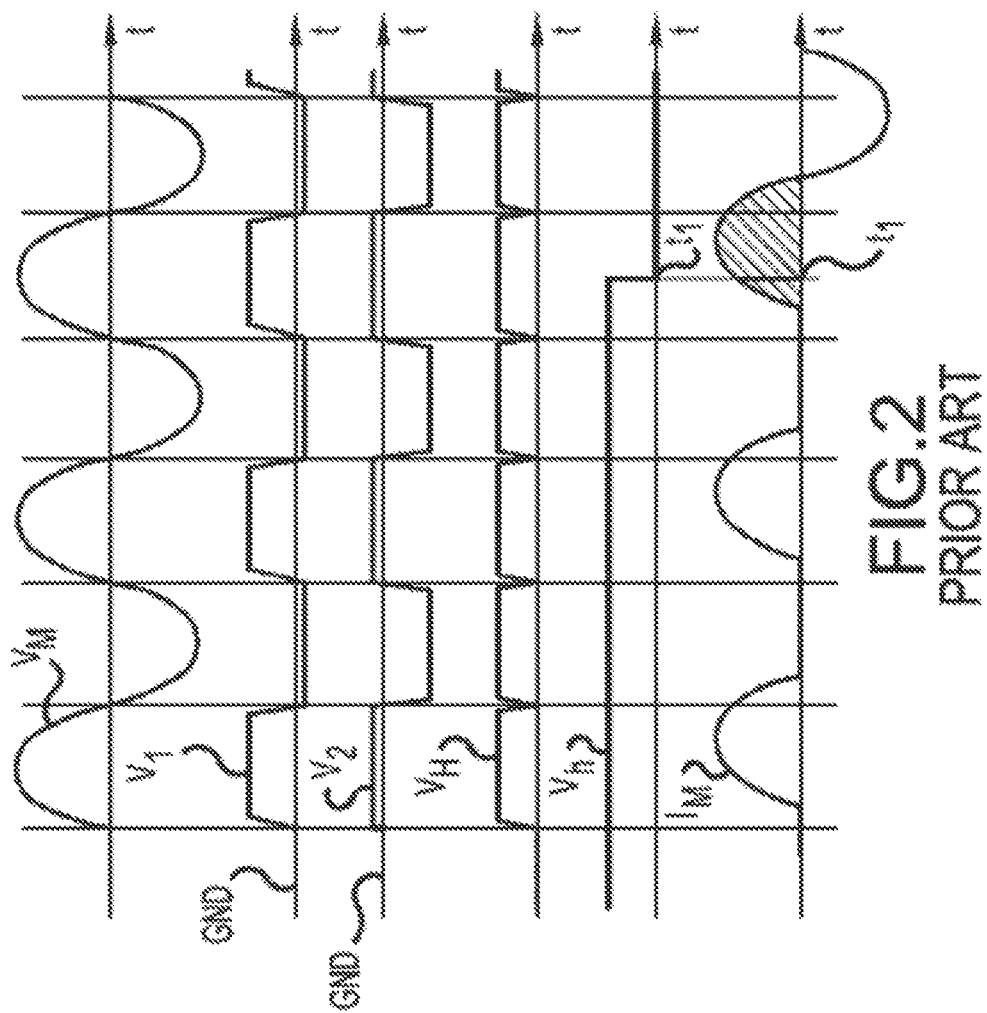
FIG. 2 illustrates a waveform of the drive circuit shown in FIG. 1.
Figure 3:
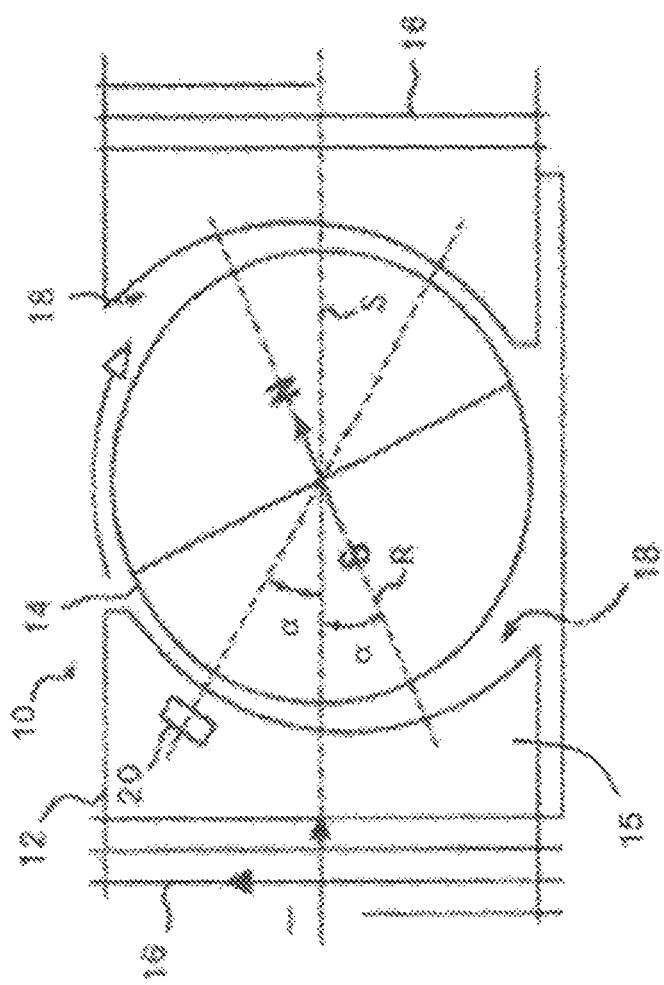
FIG. 3 illustrates a diagrammatic representation of a synchronous motor, according to an embodiment of the present teaching.

FIG. 3 schematically shows a synchronous motor according to an embodiment of the present invention. The synchronous motor 10 includes a stator 12 and a permanent magnet rotor 14 rotatably disposed between magnetic poles of the stator 12, and the stator 12 includes a stator core 15 and a stator winding 16 wound on the stator core 15. The rotor 14 includes at least one permanent magnet forming at least one pair of permanent magnetic poles with opposite polarities, and the rotor 14 operates at a constant rotational speed of 60 f/p during a steady state phase in a case that the stator winding 16 is connected to an AC power supply, where f is a frequency of the AC power supply and p is the number of pole pairs of the rotor.

Non-uniform gap 18 is formed between the magnetic poles of the stator 12 and the permanent magnetic poles of the rotor 14 so that a polar axis R of the rotor 14 has an angular offset a relative to a central axis S of the stator 12 in a case that the rotor is at rest. The rotor 14 may be configured to have a fixed starting direction (a clockwise direction in this embodiment as shown by the arrow in FIG. 3) every time the stator winding 16 is energized. The stator and the rotor each have two magnetic poles as shown in FIG. 3. It can be understood that, in other embodiments, the stator and the rotor may also have more magnetic poles, such as 4 or 6 magnetic poles.

A position sensor 20 for detecting the angular position of the rotor is disposed on the stator 12 or at a position near the rotor inside the stator, and the position sensor 20 has an angular offset relative to the central axis S of the stator. Preferably, this angular offset is also a, as in this embodiment. Preferably, the position sensor 20 is a Hall effect sensor.

Figure 4:
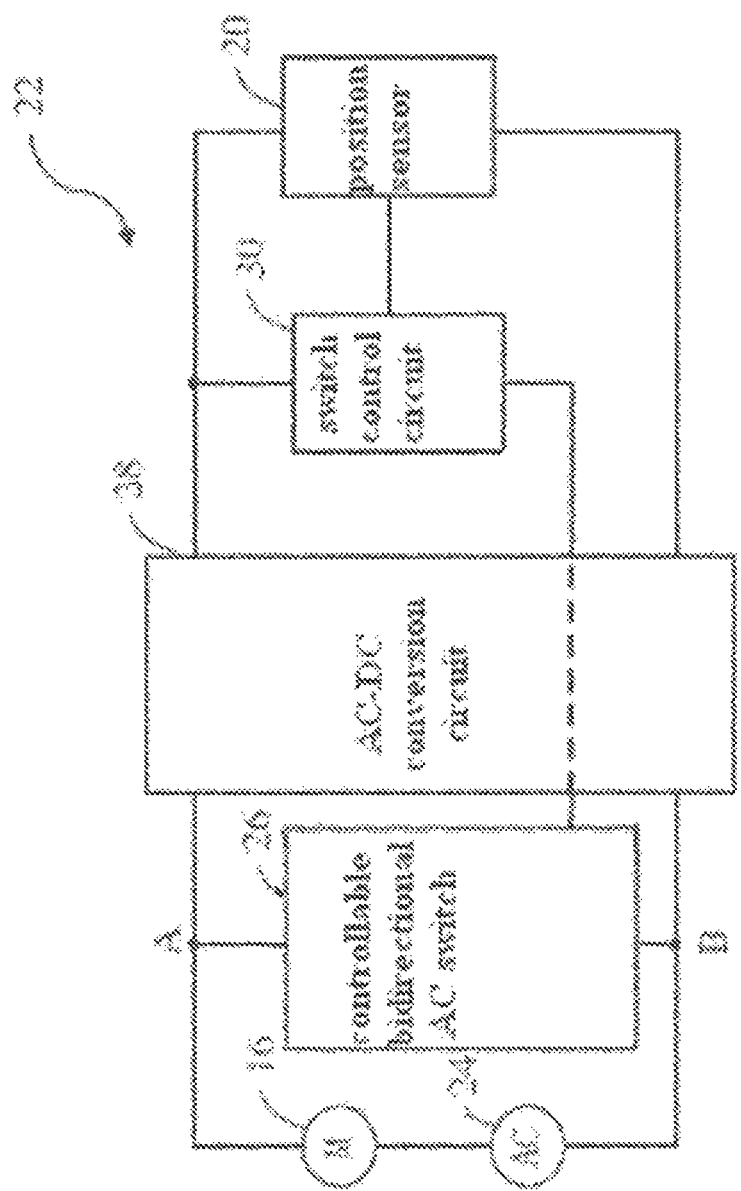
FIG. 4 illustrates a block diagram of a drive circuit for a synchronous motor, according to an embodiment of the present teaching.

FIG. 4 shows a block diagram of a drive circuit for a synchronous motor according to an embodiment of the present invention. In the drive circuit 22, the stator winding 16 and the AC power supply 24 are connected in series between two nodes A and B. Preferably, the AC power supply 24 may be a commercial AC power supply with a fixed frequency, such as 50 Hz or 60 Hz, and a supply voltage may be, for example, 110V, 220V or 230V. A controllable bidirectional AC switch 26 is connected between the two nodes A and B, in parallel with the stator winding 16 and the AC power supply 24. Preferably, the controllable bidirectional AC switch 26 is a TRIAC, of which two anodes are connected to the two nodes A and B respectively. It can be understood that, the controllable bidirectional AC switch 26 alternatively may be two silicon control rectifiers reversely connected in parallel, and control circuits may be correspondingly configured to control the two silicon control rectifiers in a preset way. An AC-DC conversion circuit 28 is also connected between the two nodes A and B. An AC voltage between the two nodes A and B is converted by the AC-DC conversion circuit 28 into a low voltage DC. The position sensor 20 may be powered by the low voltage DC output by the AC-DC conversion circuit 28, for detecting the magnetic pole position of the permanent magnet rotor 14 of the synchronous motor 10 and outputting a corresponding signal. A switch control circuit 30 is connected to the AC-DC conversion circuit 28, the position sensor 20 and the controllable bidirectional AC switch 26, and is configured to control the controllable bidirectional AC switch 26 to be switched between a switch-on state and a switch-off state in a predetermined way, based on the magnetic pole position of the permanent magnet rotor which is detected by the position sensor and polarity information of the AC power supply 24 which may be obtained from the AC-DC conversion circuit 28, such that the stator winding 16 urges the rotor 14 to rotate only in the above-mentioned fixed starting direction during a starting phase of the motor. According to this embodiment of the present invention, in a case that the controllable bidirectional AC switch 26 is switched on, the two nodes A and B are shorted, the AC-DC conversion circuit 28 does not consume electric energy since there is no current flowing through the AC-DC conversion circuit 28, hence, the utilization efficiency of electric energy can be improved significantly.

Figure 5:
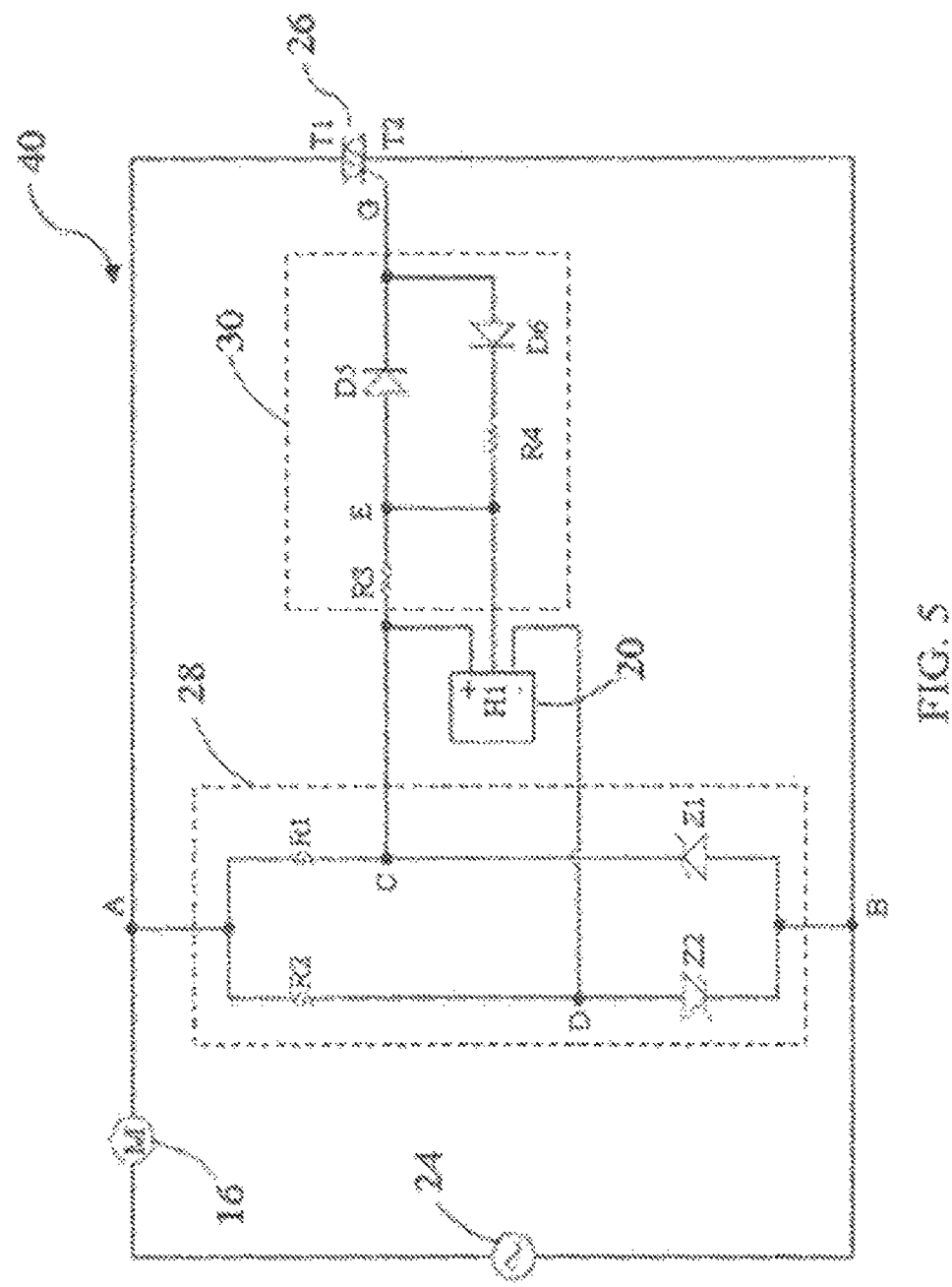
FIG. 5 illustrates a drive circuit for a synchronous motor, according to an embodiment of the present teaching.

FIG. 5 shows a circuit diagram of a drive circuit 40 for a synchronous motor according to a first embodiment of the present disclosure. The stator winding 16 of the synchronous motor is connected in series with the AC power supply 24 between the two nodes A and B. A first anode T1 of the TRIAC 26 is connected to the node A, and a second anode T2 of the TRIAC 26 is connected to the node B. The AC-DC conversion circuit 28 is connected in parallel with the TRIAC 26 between the two nodes A and B. An AC voltage between the two nodes A and B is converted by the AC-DC conversion circuit 28 into a low voltage DC (preferably, low voltage ranges from 3V to 18V). The AC-DC conversion circuit 28 includes a first zener diode Z1 and a second zener diode Z2 which are reversely connected in parallel between the two nodes A and B via a first resistor R1 and a second resistor R2 respectively. A high voltage output terminal C of the AC-DC conversion circuit 28 is formed at a connection point of the first resistor R1 and a cathode of the first zener diode Z1, and a low voltage output terminal D of the AC-DC conversion circuit 28 is formed at a connection point of the second resistor R2 and an anode of the second zener diode Z2. The voltage output terminal C is connected to a positive power supply terminal of the position sensor 20, and the voltage output terminal D is connected to a negative power supply terminal of the position sensor 20. Three terminals of the switch control circuit 30 are connected to the high voltage output terminal C of the AC-DC conversion circuit 28, an output terminal H1 of the position sensor 20 and a control electrode G of the TRIAC 26 respectively. The switch control circuit 30 includes a third resistor R3, a fifth diode D5, and a fourth resistor R4 and a sixth diode D6 connected in series between the output terminal HI of the position sensor 20 and the control electrode G of the controllable bidirectional AC switch 26. An anode of the sixth diode D6 is connected to the control electrode G of the controllable bidirectional AC switch 26. One terminal of the third resistor R3 is connected to the high voltage output terminal C of the AC-DC conversion circuit 28, and the other terminal of the third resistor R3 is connected to an anode of the fifth diode D5. A cathode of the fifth diode D5 is connected to the control electrode G of the controllable bidirectional AC switch 26.

Figure 6:
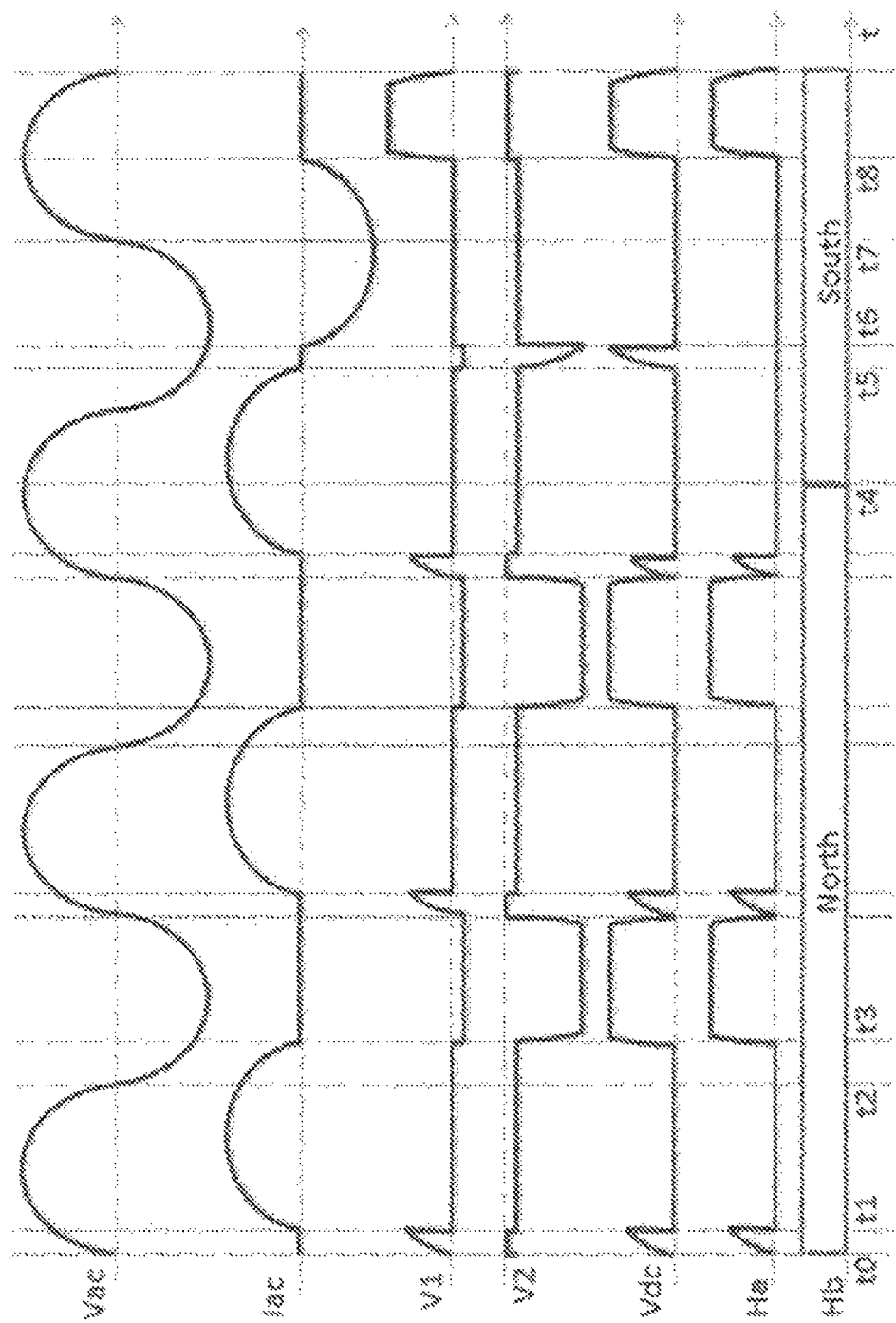
FIG. 6 illustrates a waveform of the drive circuit shown in FIG. 5.

In conjunction with FIG. 6, an operational principle of the drive circuit 40 is described. In FIG. 6, Vac indicates a waveform of voltage of the AC power supply 24, and Iac indicates a waveform of current flowing through the stator winding 16. Due to the inductive character of the stator winding 16, the waveform of current Iac lags behind the waveform of voltage Vac. V1 indicates a waveform of voltage between two terminals of the first zener diode Z1, V2 indicates a waveform of voltage between two terminals of the second zener diode Z2, Vdc indicates a waveform of voltage between two output terminals C and D of the AC-DC conversion circuit 28, Ha indicates a waveform of a signal output by the output terminal H1 of the position sensor 20, and Hb indicates a rotor magnetic field detected by the position sensor 20. In this embodiment, in a case that the position sensor 20 is powered normally, the output terminal H1 outputs a logic high level in a case that the detected rotor magnetic field is North, or the output terminal H1 outputs a logic low level in a case that the detected rotor magnetic field is South.

In a case that the rotor magnetic field Hb detected by the position sensor 20 is North, in a first positive half cycle of the AC power supply, the supply voltage is gradually increased from a time instant t0 to a time instant t1, the output terminal H1 of the position sensor 20 outputs a high level, and a current flows through the resistor R1, the resistor R3, the diode D5 and the control electrode G and the second anode T2 of the TRIAC 26 sequentially. The TRIAC 26 is switched on in a case that a drive current flowing through the control electrode G and the second anode T2 is greater than a gate triggering current Ig. Once the TRIAC 26 is switched on, the two nodes A and B are shorted, a current flowing through the stator winding 16 in the motor is gradually increased until a large forward current flows through the stator winding 16 to drive the rotor 14 to rotate clockwise as shown in FIG. 3. Since the two nodes A and B are shorted, there is no current flowing through the AC-DC conversion circuit 28 from the time instant t1 to a time instant t2. Hence, the resistors R1 and R2 do not consume electric energy, and the output of the position sensor 20 is stopped due to no power is supplied. Since the current flowing through two anodes T1 and T2 of the TRIAC 26 is large enough (which is greater than a holding current Ihold), the TRIAC 26 is kept to be switched on in a case that there is no drive current flowing through the control electrode G and the second anode T2. In a negative half cycle of the AC power supply, after a time instant t3, a current flowing through T1 and T2 is less than the holding current Ihold, the TRIAC 26 is switched off, a current begins to flow through the AC-DC conversion circuit 28, and the output terminal HI of the position sensor 20 outputs a high level again. Since a potential at the point C is lower than a potential at the point E, there is no drive current flowing through the control electrode G and the second anode T2 of the TRIAC 26, and the TRIAC 26 is kept to be switched off. Since the resistance of the resistors R1 and R2 in the AC-DC conversion circuit 28 are far greater than the resistance of the stator winding 16 in the motor, a current currently flowing through the stator winding 16 is far less than the current flowing through the stator winding 16 from the time instant t1 to the time instant t2 and generates very small driving force for the rotor 14. Hence, the rotor 14 continues to rotate clockwise due to inertia. In a second positive half cycle of the AC power supply, similar to the first positive half cycle, a current flows through the resistor R1, the resistor R3, the diode D5, and the control electrode G and the second anode T2 of the TRIAC 26 sequentially. The TRIAC 26 is switched on again, and the current flowing through the stator winding 16 continues to drive the rotor 14 to rotate clockwise. Similarly, the resistors R1 and R2 do not consume electric energy since the two nodes A and B are shorted. In the next negative half cycle of the power supply, the current flowing through the two anodes T1 and T2 of the TRIAC 26 is less than the holding current Ihold, the TRIAC 26 is switched off again, and the rotor continues to rotate clockwise due to the effect of inertia.

At a time instant t4, the rotor magnetic field Hb detected by the position sensor 20 changes to be South from North, the AC power supply is still in the positive half cycle and the TRIAC 26 is switched on, the two nodes A and B are shorted, and there is no current flowing through the AC-DC conversion circuit 28. After the AC power supply enters the negative half cycle, the current flowing through the two anodes T1 and T2 of the TRIAC 26 is gradually decreased, and the TRIAC 26 is switched off at a time instant t5. Then the current flows through the second anode T2 and the control electrode G of the TRIAC 26, the diode D6, the resistor R4, the position sensor 20, the resistor R2 and the stator winding 16 sequentially. As the drive current is gradually increased, the TRIAC 26 is switched on again at a time instant t6, the two nodes A and B are shorted again, the resistors RI and R2 do not consume electric energy, and the output of the position sensor 20 is stopped due to no power is supplied. There is a larger reverse current flowing through the stator winding 16, and the rotor 14 continues to be driven clockwise since the rotor magnetic field is South. From the time instant t5 to the time instant t6, the first zener diode Z1 and the second zener diode Z2 are switched on, hence, there is a voltage output between the two output terminals C and D of the AC-DC conversion circuit 28. At a time instant t7, the AC power supply enters the positive half cycle again, the TRIAC 26 is switched off when the current flowing through the TRIAC 26 crosses zero, and then a voltage of the control circuit is gradually increased. As the voltage is gradually increased, a current begins to flow through the AC-DC conversion circuit 28, the output terminal H1 of the position sensor 20 outputs a low level, there is no drive current flowing through the control electrode G and the second anode T2 of the TRIAC 26, hence, the TRIAC 26 is switched off. Since the current flowing through the stator winding 16 is very small, nearly no driving force is generated for the rotor 14. At a time instant t8, the power supply is in the positive half cycle, the position sensor outputs a low level, the TRIAC 26 is kept to be switched off after the current crosses zero, and the rotor continues to rotate clockwise due to inertia. According to an embodiment of the present invention, the rotor may be accelerated to be synchronized with the stator after rotating only one circle after the stator winding is energized.

In the embodiment of the present invention, by taking advantage of a feature of a TRIAC that the TRIAC is kept to be switched on although there is no drive current flowing though the TRIAC once the TRIAC is switched on, it is avoided that a resistor in the AC-DC conversion circuit still consumes electric energy after the TRIAC is switched on, hence, the utilization efficiency of electric energy can be improved significantly.

Figure 7:
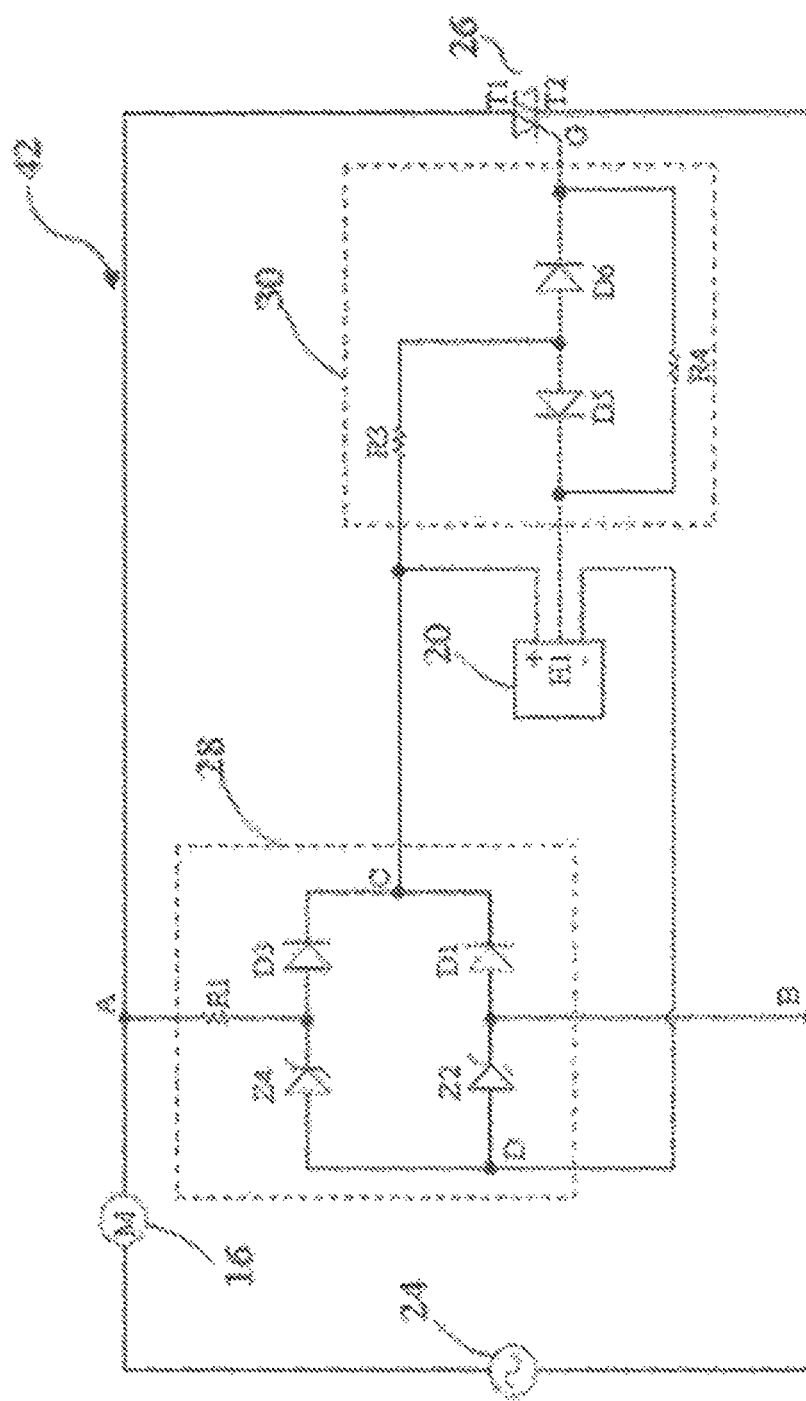
FIGS. 7 to 10 illustrate different embodiments of a drive circuit of a synchronous motor, according to an embodiment of the present teaching.

FIG. 7 shows a circuit diagram of a drive circuit 42 for a synchronous motor according to an embodiment of the present disclosure. The stator winding 16 of the synchronous motor is connected in series with the AC power supply 24 between the two nodes A and B. A first anode T1 of the TRIAC 26 is connected to the node A, and a second anode T2 of the TRIAC 26 is connected to the node B. The AC-DC conversion circuit 28 is connected in parallel with the TRIAC 26 between the two nodes A and B. An AC between the two nodes A and B is converted by the AC-DC conversion circuit 28 into a low voltage DC, preferably, a low voltage ranging from 3V to 18V. The AC-DC conversion circuit 28 includes a first resistor RI and a full wave bridge rectifier connected in series between the two nodes A and B. The full wave bridge rectifier includes two rectifier branches connected in parallel, one of the two rectifier branches includes a first diode D1 and a third diode D3 reversely connected in series, and the other of the two rectifier branches includes a second zener diode Z2 and a fourth zener diode Z4 reversely connected in series, the high voltage output terminal C of the AC-DC conversion circuit 28 is formed at a connection point of a cathode of the first diode D1 and a cathode of the third diode D3, and the low voltage output terminal D of the AC-DC conversion circuit 28 is formed at a connection point of an anode of the second zener diode Z2 and an anode of the fourth zener diode Z4. The output terminal C is connected to a positive power supply terminal of the position sensor 20, and the output terminal D is connected to a negative power supply terminal of the position sensor 20. The switch control circuit 30 includes a third resistor R3, a fourth resistor R4, and a fifth diode D5 and a sixth diode D6 reversely connected in series between the output terminal H1 of the position sensor 20 and the control electrode G of the controllable bidirectional AC switch 26. A cathode of the fifth diode D5 is connected to the output terminal H1 of the position sensor, and a cathode of the sixth diode D6 is connected to the control electrode G of the controllable bidirectional AC switch. One terminal of the third resistor R3 is connected to the high voltage output terminal C of the AC-DC conversion circuit, and the other terminal of the third resistor R3 is connected to a connection point of an anode of the fifth diode D5 and an anode of the sixth diode D6. Two terminals of the fourth resistor R4 are connected to a cathode of the fifth diode D5 and a cathode of the sixth diode D6 respectively.

Figure 8:
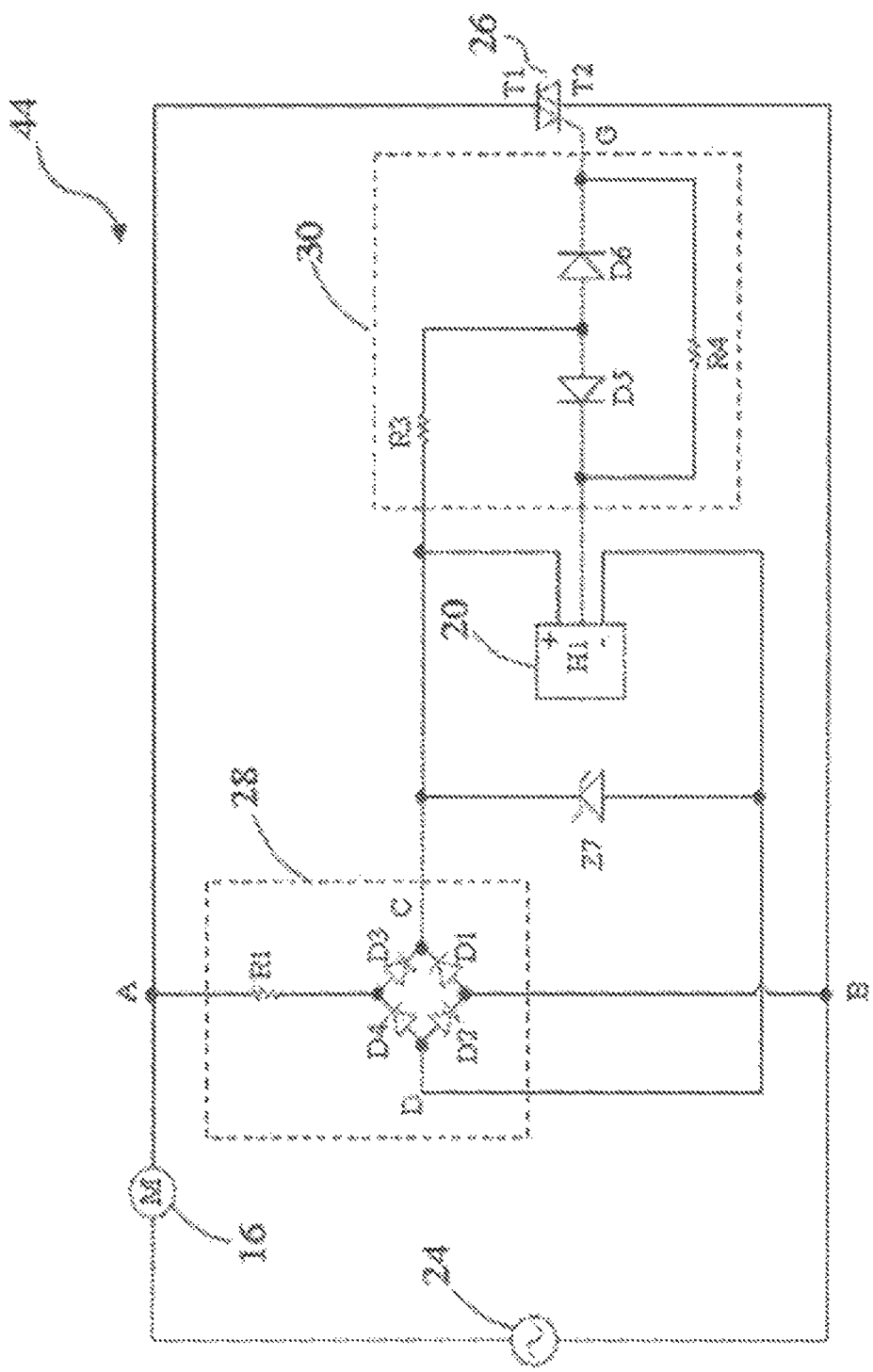

FIG. 8 shows a circuit diagram of a drive circuit 44 for a synchronous motor according to a further embodiment of the present invention. The drive circuit 44 is similar to the drive circuit 42 in the previous embodiment and, the drive circuit 44 differs from the drive circuit 42 in that, the zener diodes Z2 and Z4 in the drive circuit 42 are replaced by general diodes D2 and D4 in the rectifier of the drive circuit 44. In addition, a zener diode Z7 is connected between the two output terminals C and D of the AC-DC conversion circuit 28 in the drive circuit 44.

Figure 9:
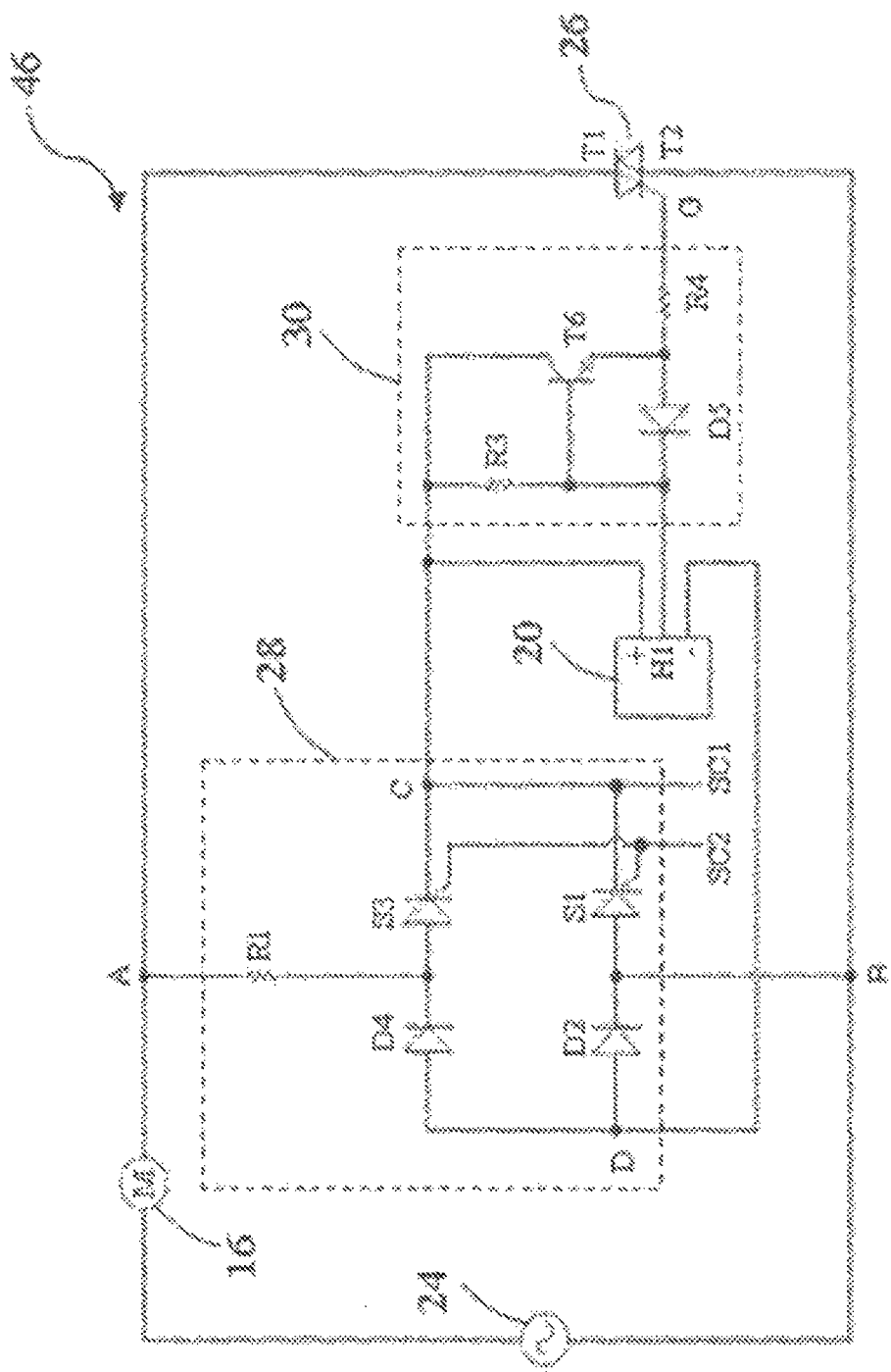

FIG. 9 shows a circuit diagram of a drive circuit 46 for a synchronous motor according to further embodiment of the present invention. The stator winding 16 of the synchronous motor is connected in series with the AC power supply 24 between the two nodes A and B. A first anode T1 of the TRIAC 26 is connected to the node A, and a second anode T2 of the TRIAC 26 is connected to the node B. The AC-DC conversion circuit 28 is connected in parallel with the TRIAC 26 between the two nodes A and B. An AC voltage between the two nodes A and B is converted by the AC-DC conversion circuit 28 into a low voltage DC, preferably, a low voltage ranging from 3V to 18V. The AC-DC conversion circuit 28 includes a first resistor R1 and a full wave bridge rectifier connected in series between the two nodes A and B. The full wave bridge rectifier includes two rectifier branches connected in parallel, one of the two rectifier branches includes two silicon control rectifiers S1 and S3 reversely connected in series, and the other of the two rectifier branches includes a second diode D2 and a fourth diode D4 reversely connected in series. The high voltage output terminal C of the AC-DC conversion circuit 28 is formed at a connection point of a cathode of the silicon control rectifier S1 and a cathode of the silicon control rectifier S3, and the low voltage output terminal D of the AC-DC conversion circuit 28 is formed at a connection point of an anode of the second diode D2 and an anode of the fourth diode D4. The output terminal C is connected to a positive power supply terminal of the position sensor 20, and the output terminal D is connected to a negative power supply terminal of the position sensor 20. The switch control circuit 30 includes a third resistor R3, an NPN transistor T6, and a fourth resistor R4 and a fifth diode D5 connected in series between the output terminal H1 of the position sensor 20 and the control electrode G of the controllable bidirectional AC switch 26. A cathode of the fifth diode D5 is connected to the output terminal H1 of the position sensor. One terminal of the third resistor R3 is connected to the high voltage output terminal C of the AC-DC conversion circuit, and the other terminal of the third resistor R3 is connected to the output terminal H1 of the position sensor. A base of the NPN transistor T6 is connected to the output terminal H1 of the position sensor, an emitter of the NPN transistor T6 is connected to an anode of the fifth diode D5, and a collector of the NPN transistor T6 is connected to the high voltage output terminal C of the AC-DC conversion circuit.

In this embodiment, a reference voltage may be input to the cathodes of the two silicon control rectifiers S1 and S3 via a terminal SC1, and a control signal may be input to control terminals of S1 and S3 via a terminal SC2. The rectifiers Si and S3 are switched on in a case that the control signal input from the terminal SC2 is a high level, or are switched off in a case that the control signal input from the terminal SC2 is a low level. Based on the configuration, the rectifiers S1 and S3 may be switched between a switch-on state and a switch-off state in a preset way by inputting the high level from the terminal SC2 in a case that the drive circuit operates normally. The rectifiers Si and S3 are switched off by changing the control signal input from the terminal SC2 from the high level to the low level in a case that the drive circuit fails. In this case, the TRIAC 26, the conversion circuit 28 and the position sensor 20 are switched off, to ensure the whole circuit to be in a zero-power state.

Figure 10:
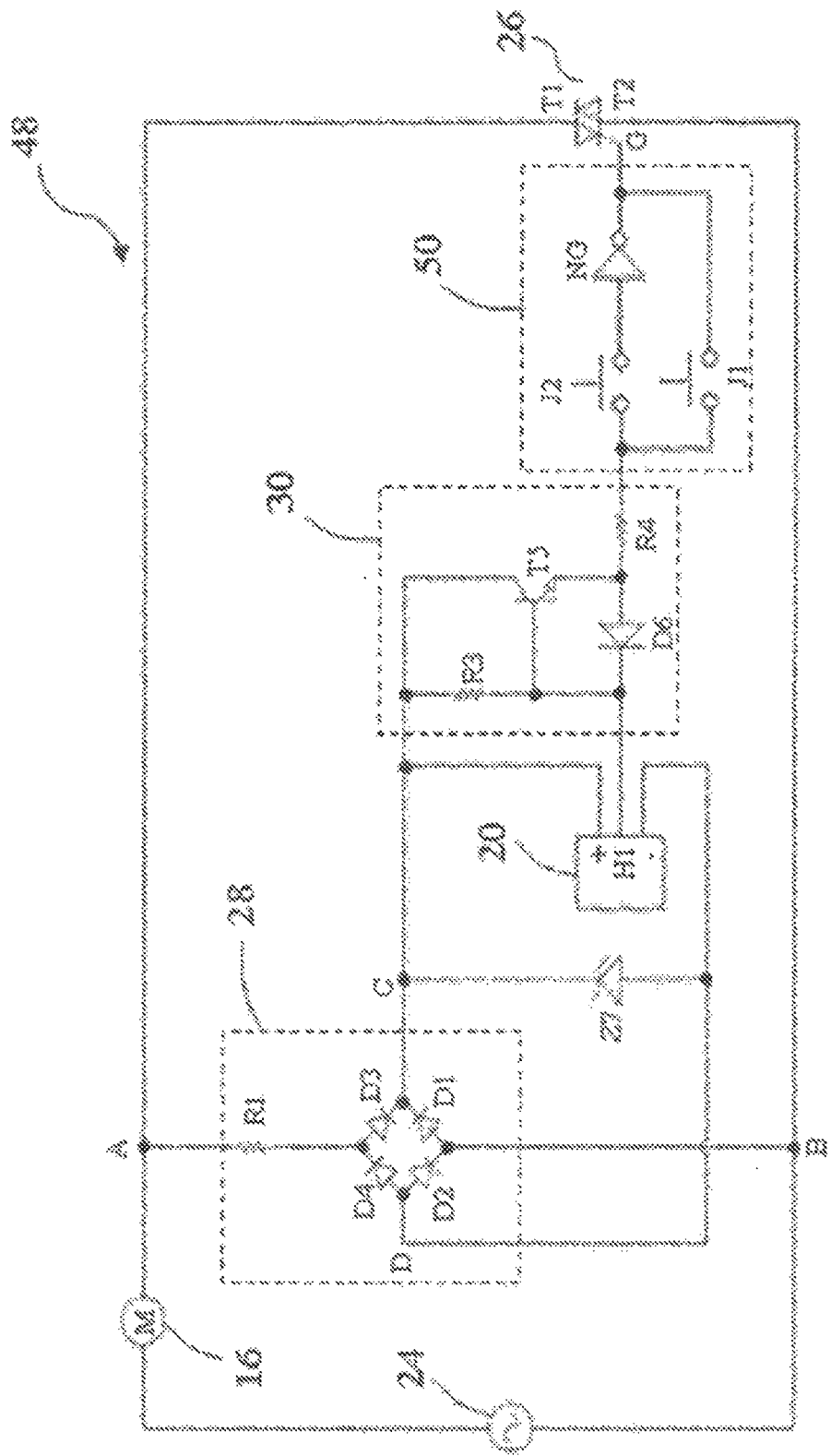

FIG. 10 shows a circuit diagram of a drive circuit 48 for a synchronous motor according to another embodiment of the present invention. The drive circuit 48 is similar to the drive circuit 46 in the previous embodiment and, the drive circuit 48 differs from the drive circuit 46 in that, the silicon control diodes S1 and S3 in the drive circuit 46 are replaced by general diodes D1 and D3 in the rectifier of the drive circuit 48, and a zener diode Z7 is connected between the two terminals C and D of the AC-DC conversion circuit 28. In addition, in the drive circuit 48 according to the embodiment, a preset steering circuit 50 is disposed between the switch control circuit 30 and the TRIAC 26. The preset steering circuit 50 includes a first jumper switch J1, a second jumper J2 switch and an inverter NG connected in series with the second jumper switch J2. Similar to the drive circuit 46, in this embodiment, the switch control circuit 30 includes the resistor R3, the resistor R4, the NPN transistor T5 and the diode D6. One terminal of the resistor R4 is connected to a connection point of an emitter of the transistor T5 and an anode of the diode D6, and the other terminal of the resistor R4 is connected to one terminal of the first jumper switch J1, and the other terminal of the first jumper switch J1 is connected to the control electrode G of the TRIAC 26, and the second jumper switch J2 and the inverter NG connected in series are connected across two terminals of the first jumper switch J1. In this embodiment, when the first jumper switch J1 is switched on and the second jumper switch J2 is switched off, similar to the above embodiments, the rotor 14 still starts clockwise; when the second jumper switch J2 is switched on and the first jumper switch J1 is switched off, the rotor 14 starts counterclockwise. In this case, a starting direction of the rotor in the motor may be selected by selecting one of the two jumper switches to be switched on and the other to be switched off. Therefore, in a case that a driving motor is needed to be supplied for different applications having opposite rotational directions, it is just needed to select one of the two jumper switches J1 and J2 to be switched on and the other to be switched off, and no other changes need to be made to the drive circuit, hence, the drive circuit according to this embodiment has good versatility.

As discussed above, the position sensor 20 is configured for detecting the magnetic pole position of the permanent magnet rotor 14 of the synchronous motor 10 and outputting a corresponding signal. The output signal from the position sensor 20 represents some characteristics of the magnetic pole position such as the polarity of the magnetic field associated with the magnetic pole position of the permanent magnet rotor 14 of the synchronous motor 10. The detected magnetic pole position is then used, by the switch control circuit 30, control the controllable bidirectional AC switch 26 to be switched between a switch-on state and a switch-off state in a predetermined way, based on, together with the magnetic pole position of the permanent magnet rotor, the polarity information of the AC power supply 24 which may be obtained from the AC-DC conversion circuit 28. It should be appreciated that the switch control circuit 30 and the position sensor 20 can be realized via magnetic sensing. Accordingly, the present teaching discloses a magnetic sensor for magnetic sensing and control of a motor according to the sensed information.

More details are disclosed below on the magnetic sensor that comprises aspects of both the position sensor 20 and the switch control circuit 30. In describing the details of the magnetic sensor related to both the position sensor 20 and the switch control circuit 30, the present teaching of this continuation-in-part application more focuses on various details related to the realization of the switch control circuit 30 via the magnetic sensor as disclosed herein.

The magnetic sensor according to the present teaching includes a magnetic field detecting circuit that can reliably detect a magnetic field and generate a magnetic induction signal indicative of certain characteristics of the magnetic field. The magnetic sensor as disclosed herein also includes an output control circuit that controls the magnetic sensor to operate in a state determined with respect to the polarity of the magnetic field as well as that of an AC power supply. As the magnetic sensor is coupled with the bidirectional AC switch 26, the magnetic sensor can effectively regulate the operation of the motor via the bidirectional AC switch. Further, the magnetic sensor in the present teaching may be directly connected to a commercial/residential AC power supply with no need for any additional A/D converting equipment. In this way, the present disclosure of the magnetic sensor is suitable to be used in a wide range of applications.

Additional novel features associated with the magnetic sensor disclosed herein will be set forth in part in the description which follows, and in part will become apparent to those skilled in the art upon examination of the following and the accompanying drawings or may be learned by production or operation of the examples. The novel features of the present teachings on a magnetic sensor may be realized and attained by practice or use of various aspects of the methodologies, instrumentalities and combinations set forth in the detailed examples discussed below. The disclosed magnetic sensor, the signal processing method implemented in the magnetic sensor, and the electric motor incorporating the magnetic sensor and the signal processing method disclosed herein can be achieved realized based on any circuit technology known to one of ordinary skill in the art including but not limited to the integrated circuit and other circuit implementations.

Figure 11:
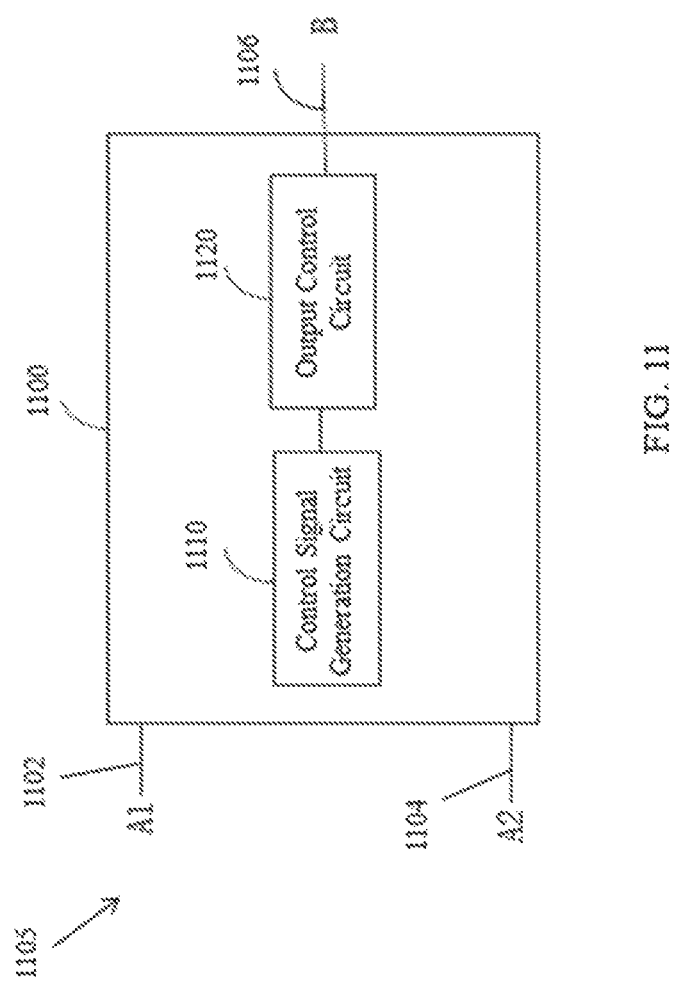
FIG. 11 illustrates an exemplary diagram of a magnetic sensor 1105 according to an embodiment of the present teaching.

FIG. 11 illustrates an exemplary diagram of a magnetic sensor 1105 according to an embodiment of the present teaching. The magnetic sensor 1105 includes a housing (not shown), a semiconductor substrate residing in the housing (not shown), a first input A1 1102, a second input A2 1104, an output port B 1106, and an electronic circuit 1100 residing on the semiconductor substrate. The electronic circuit 1100 includes a control signal generation circuit 1110 and an output control circuit 1120 coupled to the control signal generation circuit 1110. In an embodiment, the first input A1 1102 and the second input A2 1104 may be connected to an external power supply directly (e.g., 1610 in FIG. 16). In an embodiment, the first input A1 1102 and the second input A2 1104 may be connected in series to the external power supply through, e.g., an external load.

The control signal generation circuit 1110 may be configured to detect one or more signals, and generate a control signal based on the detected one or more signals. In some examples, the one or more signals may be one or more electrical signals received through electrical wires or cables. In some other examples, the one or more signals may be one or more magnetic signals or other types of signals received by the magnetic sensor 1105 wirelessly or by other means.

In operation, the control signal generation circuit 1110 determines, based on one or more detected signals, whether a predetermined condition is satisfied. If the predetermined condition based on the one or more detected signals, the control signal generation circuit 1110 may generate and transmit a first control signal to the output control circuit 1120 that will then accordingly control the magnetic sensor 1105 to operate in a first state. In the first state, an electrical (load) current may flow out of the magnetic sensor to the output port B 1106. The control signal generation circuit 1110 may also generate and transmit a second control signal to the output control circuit 1120 to control the magnetic sensor 1105 to operate in a second state. In the second state, the electrical (load) current may flow from the output port B 1106 into the magnetic sensor. How to determine the first state or the second state at the control signal generation circuit is described in further details.

On the other hand, when it is determined that the predetermined condition is not satisfied based on the one or more detected signals, the control signal generation circuit 1110 may generate and transmit a third control signal to the output control circuit 1120 to control the magnetic sensor 1105 to operate in a third state. In the third state, no electrical (load) current flows through the output port B 1106. In some situations in the third state, only a small amount of current flows through the output port B 1106, e.g., the intensity of the current is less than one fourth of the electrical (load) current.

In some embodiment, the output control circuit 1120 is coupled with the control signal generation circuit 1110 and configured to control the magnetic sensor 1105 to operate in a state determined based on the control signal received from the control signal generation circuit 1110. For example, when the output control circuit 1120 receives the first control signal, the output control circuit 1120 controls the magnetic sensor 1105 to operate in the first state in which the electrical (load) current flows out to the output port B 1106. When the output control circuit 1120 receives the second control signal, the output control circuit 1120 controls the magnetic sensor 1105 to operate in the second state in which the electrical (load) current flows from outside into the magnetic sensor via the output port B 1106. When the output control circuit 1120 receives the third control signal, the output control circuit 1120 controls the magnetic sensor 1105 to operate in the third state in which no electrical (load) current flows through the output port B 1106 (or only a small amount of current flows through when compared with the electrical (load) current, e.g., such a current is less than one fourth of the electrical (load) current). In an embodiment, the output control circuit 1120 may alternately receive a plurality of control signals, including the first control signal and the second control signal, etc. Accordingly, the output control circuit 1120 may control the magnetic sensor 1105 to operate alternately among different states. Specifically, the magnetic sensor 1150 may operate alternately between the first state and the second state. In an embodiment, when the magnetic sensor 1105 operates in the third state, the magnetic sensor 1105 may be prevented from operating in either the first state or the second state.

In an embodiment, when the first input A1 1102 and the second input A2 1104 are connected to the external AC power supply 1610 (FIG. 16), the operating frequency of the magnetic sensor 1105, whether in the first state, the second state, or the third state, may be set to be positively proportional to the frequency of the external AC power supply 1610. In an embodiment, the operating frequency of the magnetic sensor 1105 in the third state is twice of the operating frequency of the first state or the second state, which is twice of the frequency of the external AC power supply 1610.

Figure 12:
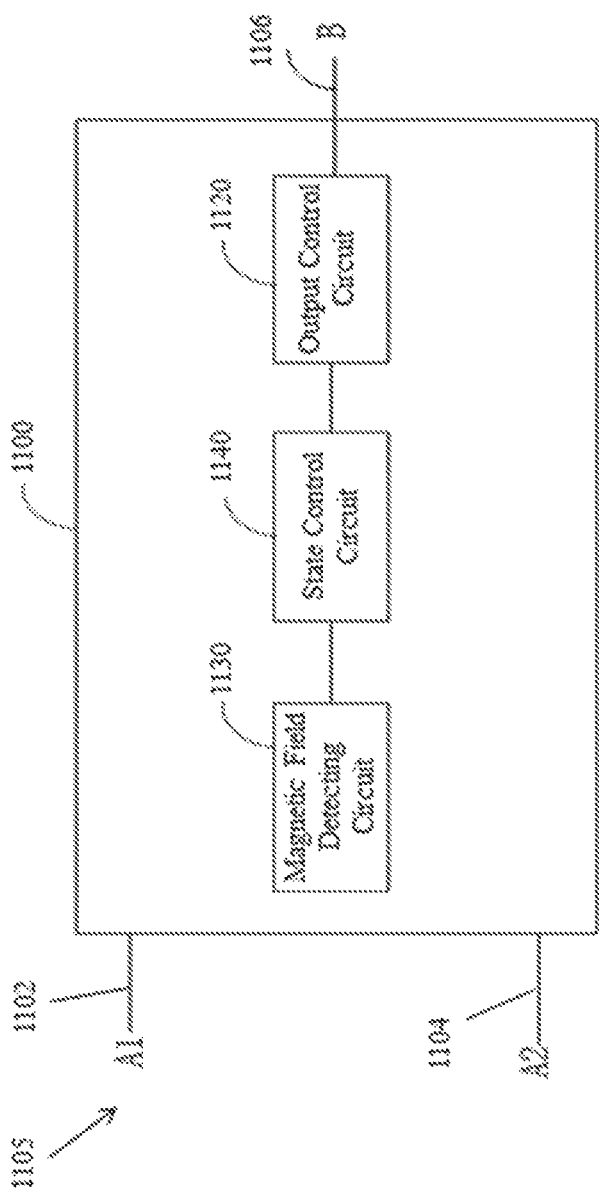
FIG. 12 illustrates an exemplary diagram of the magnetic sensor 1105 according to a different embodiment of the present teaching.

FIG. 12 illustrates an exemplary diagram of the magnetic sensor 1105 according to a different embodiment of the present teaching. In this embodiment, the magnetic sensor 1105 comprises the first input A1 1102, the second input A2 1104, the output port B 1106, and an electronic circuit 1100. The electronic circuit 1100 comprises a magnetic field detecting circuit 1130, a state control circuit 1140 coupled with the magnetic field detecting circuit 1130, and the output control circuit 1120 coupled with the state control circuit 1140.

The magnetic field detecting circuit 1130 may be configured to detect an external magnetic field and output a magnetic induction signal in accordance with the detected external magnetic field. The magnetic induction signal may indicate or represent the polarity and strength of the external magnetic field.

The state control circuit 1140 may be configured to determine whether the a predetermined condition is satisfied, and transmit a corresponding control signal to the output control circuit 1120 based on the determination upon receiving the control signal, the output control circuit 1120 may control the magnetic sensor 1105 to operate in a corresponding state determined based on the magnetic induction signal. Specifically, when the predetermined condition is satisfied, the corresponding state may be one of the first state and the second state, corresponding respectively to a specific polarity of the external magnetic field indicated by the magnetic induction signal. For example, the first state may correspond to a situation in which a first polarity of the external magnetic field is detected, and the second state may correspond to a situation in which a second polarity (which is opposite to the first polarity) of the external magnetic field is detected. Accordingly, when the predetermined condition is satisfied and the external magnetic field exhibits a first polarity, the state control circuit 1140 may transmit a control signal indicating as such to the output control circuit 1120, according to which the output control circuit 1120 may control the magnetic sensor 1105 to operate in the first state. As described above, in the first state, the electrical (load) current flow from the magnetic sensor to outside via the output port B 1106. When the predetermined condition is satisfied and the external magnetic field exhibits a second polarity that is opposite to the first polarity, the state control circuit 1140 may transmit a control signal indicating as such to the output control circuit 1120, based on which the output control circuit 1120 may control the magnetic sensor 1105 to operate in the second state. As described above, in the second state, the electrical (load) current flows from outside into the magnetic sensor via the output port B 1106.

On the other hand, when the state control circuit 1140 determines that the predetermined conditions is not satisfied (or when the state control circuit 1140 does not respond to the magnetic induction signal or cannot obtain the magnetic induction signal from the magnetic field detecting circuit 1130), the state control circuit 1120 may transmit a control signal indicating as such to output control circuit 1120 to control the magnetic sensor 1105 to operate in a third state. In the third state, no electrical (load) current flows through the output port B 1106 (or only a small amount of current flows through the output port B compared with the electrical (load) current, e.g., the intensity of the current is less than one fourth of the electrical (load) current).

The output control circuit 1120 is coupled with the control signal generation circuit 1110 and configured to control the magnetic sensor 1105 to operate in a state determined based on a control signal received from the control signal generation circuit 1110. For example, when the output control circuit 1120 receives the control signal indicating that the predetermined condition is met and a first polarity of the external magnetic field, the output control circuit 1120 controls the magnetic sensor 1105 to operate in the first state, allowing the electrical (load) current flow out of the magnetic sensor via the output port B 1106. When the output control circuit 1120 receives the control signal indicating satisfaction of the predetermined condition and a second polarity detected from the external magnetic field, the output control circuit 1120 controls the magnetic sensor 1105 to operate in the second state, allowing the electrical (load) current flow from outside into the magnetic sensor via output port B 1106. When the output control circuit 1120 receives the control signal indicating that the predetermined condition is not met, the output control circuit 1120 controls the magnetic sensor 1105 to operate in the third state, in which no electrical (load) current may flow through the output port B 1106 (or only a small amount of current flows through the output port B compared with the electrical (load) current above, e.g., the current is less than one fourth of the electrical (load) current). In an embodiment, the output control circuit 1120 may receive alternately a plurality of the control signals in time. Accordingly, the output control circuit 1120 controls the magnetic sensor 1105 to operate among different states alternately, including between the first state and the second state.

In an embodiment, the output control circuit 1120 may be configured based on a user's specification. For example, the output control circuit 1120 may be configured to control the magnetic sensor 1105 to operate alternately between a working state and a high-impedance state. The working state may correspond to the first state or the second state, and the high-impedance state may correspond to the third state.

Figure 13:
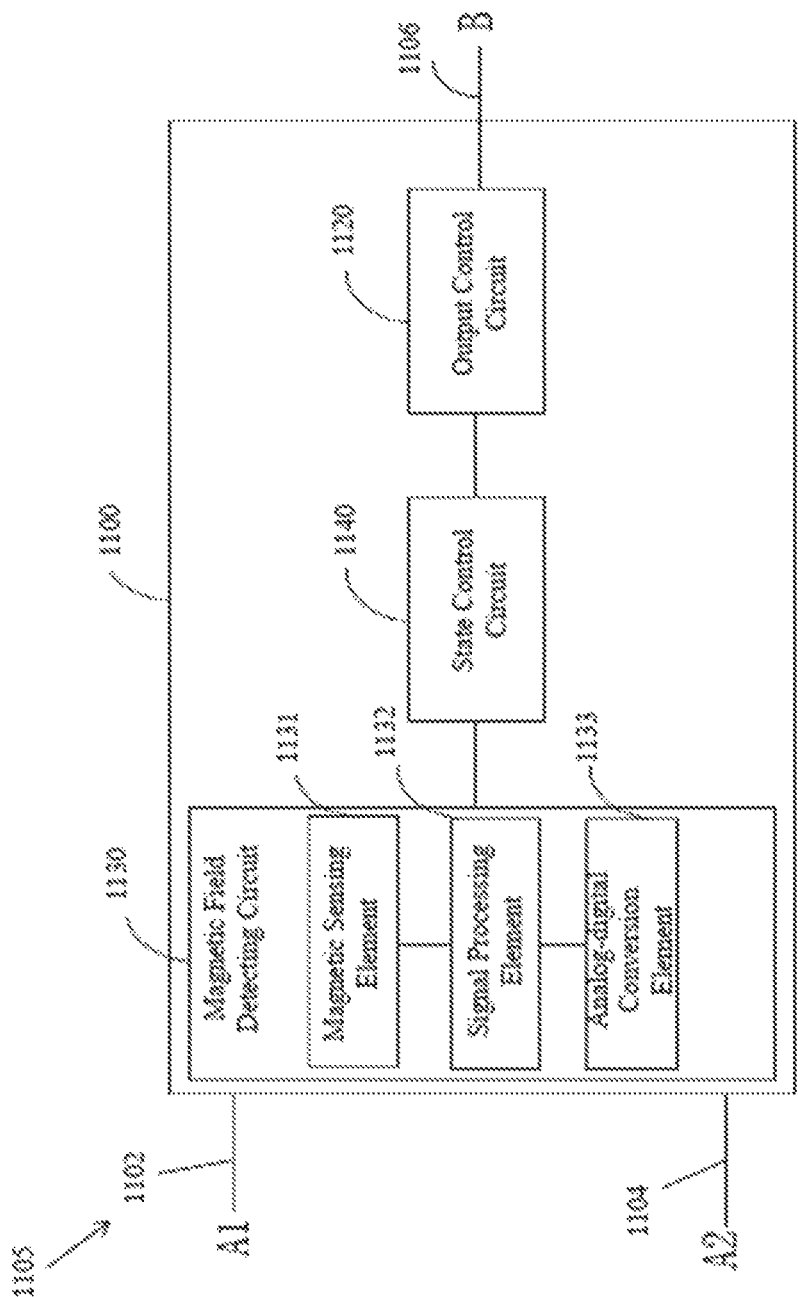
FIG. 13 illustrates an exemplary diagram of the magnetic sensor 1105 according to yet another embodiment of the present teaching.

FIG. 13 illustrates an exemplary diagram of the magnetic sensor 1105 according to yet another embodiment of the present teaching. In this embodiment, an exemplary construction of the magnetic field detecting circuit 1130 is provided. The electronic circuit 1100, similar to FIG. 12, includes the magnetic field detecting circuit 1130, the state control circuit 1140, and the output control circuit 1120. The magnetic field detecting circuit 1130 in this embodiment comprises a magnetic sensing element 1131, a signal processing element 1132, and an analog-digital conversion element 1133.

The magnetic sensing element 1131 may be configured to detect and output to the signal processing element an analog electrical signal that is indicative of certain information related to the external magnetic field. For example, the output of signal from the magnetic sensing element 1131 may indicate the polarity of the external magnetic field. In an embodiment, the magnetic sensing element 1131 may be implemented based on a Hall Board.

The signal processing element 1132 may be configured to process the analog electrical signal from the magnetic sensing element 1131 and generate a processed analog electrical signal by, e.g. amplifying and reducing the interference of the analog electrical signals in order to improve the accuracy of the detected signals. The processed analog electrical signal is sent to the analog-digital conversion element 1133.

The analog-digital conversion element 1133 may be configured to convert the processed analog electrical signal to a magnetic induction signal. In situations where only the polarity of the external magnetic field needs to be detected, the magnetic induction signal may correspond to a switching digital signal. The state control circuit 1140 and the output control circuit 1120 in FIG. 13 operate in the similar manner as disclosed with respect to FIG. 12.

Figure 14:
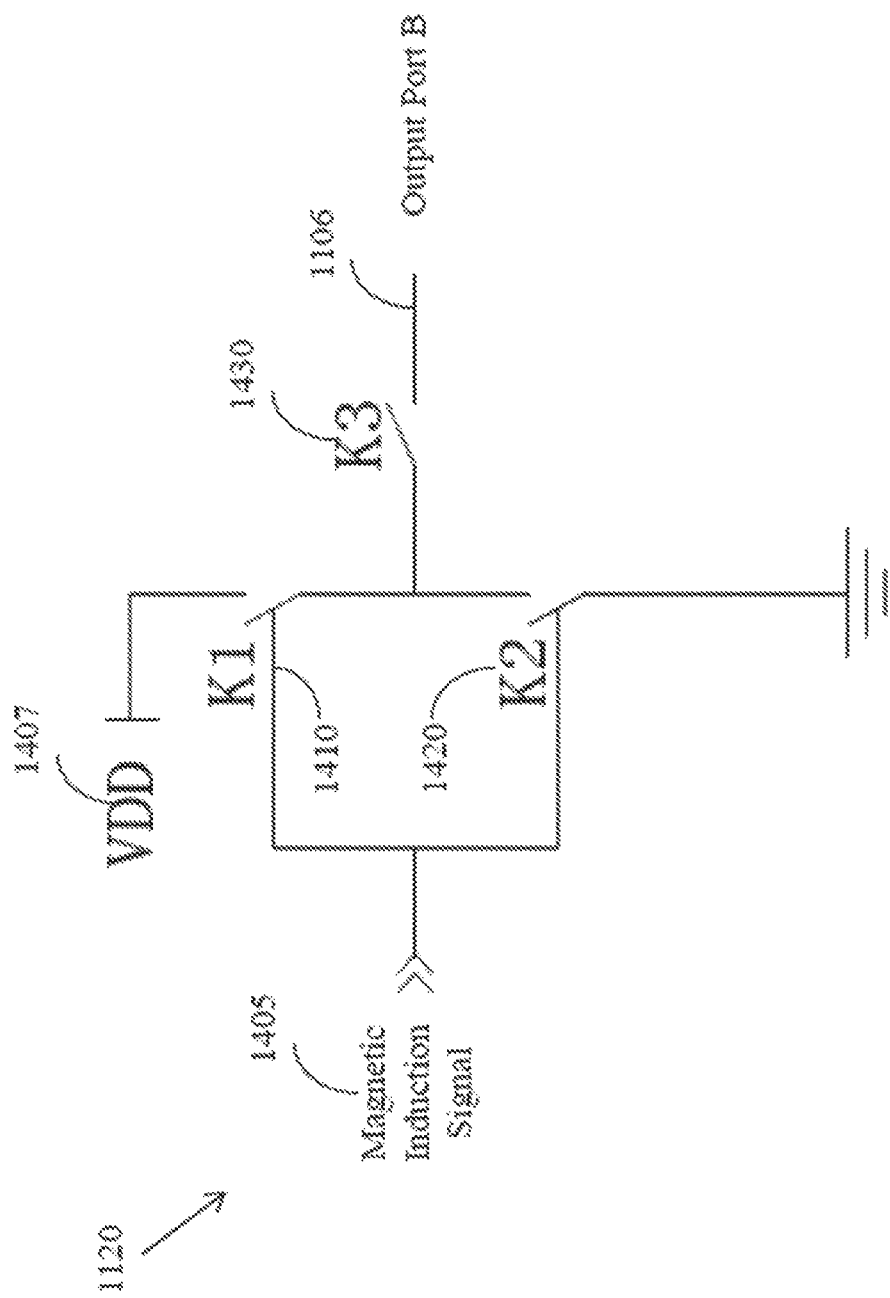
FIG. 14 illustrates an exemplary implementation of the output control circuit 1120 according to an embodiment of the present teaching.

FIG. 14 illustrates an exemplary implementation of the output control circuit 1120 according to an embodiment of the present teaching. In an embodiment, the output control circuit 1120 may be configured according to a user's specification. As shown in FIG. 14, the output control circuit 1120 includes a first switch K1 1410, a second switch K2 1420, and a third switch K3 1430. Each of the first switch K1 1410, the second switch K2 1420, and the third switch K3 1430 is a diode or a transistor. The first switch is coupled with the output port B 1106 through the third switch K3 1430 to form a first current path allowing the load current to flow through in a first direction. The second switch is coupled with the output port B 1106 through the third switch K3 1430 to form a second current path allowing the load current to flow in a second direction opposite to the first direction. The first switch K1 1410 and the second switch K2 1420 respond to the magnetic induction signal 1405 to selectively turn on the corresponding current path.

In an embodiment, the first switch K1 1410 and the second switch K2 1420 may be selectively turned on or off according to a user's specification. In an embodiment, the first switch K1 1410 and the second switch K2 1420 may be configured to receive the magnetic induction signal 1405, which indicates the detected polarity of the external magnetic field. The first switch K1 1410 and the second switch K2 1420 may be selectively turned on or off in response to the magnetic induction signal 1405. For example, the first switch K1 1410 may be a high-voltage conducting switch, and the second switch K2 1420 may be a low-voltage conducting switch. To achieve that, the first switch K1 1410 is connected to a higher voltage VDD 1407 (e.g., a direct current power supply), and the second switch K2 1420 is connected to a lower voltage (e.g., ground). When the magnetic induction signal 1405 has a high voltage, e.g., indicating a first polarity detected from the external magnetic field, the first switch K1 1410 may be turned on and the second switch K2 1420 may be turned off. When the magnetic induction signal 1405 has a low voltage, e.g., indicating a second polarity, opposite to the first polarity of the external magnetic field, the first switch K1 1410 may be turned off and the second switch K2 1420 may be turned on.

In an embodiment, the third switch K3 1430 may be turned on or off based on whether the magnetic sensor 1105 satisfies the predetermined condition. For example, when the magnetic sensor 1105 satisfies the predetermined condition, the third switch K3 1430 may be turned on. Otherwise, the third switch K3 1430 may be turned off. Details on how to control the third switch is discussed with respect to FIG. 18.

As described above, when the magnetic sensor 1105 satisfies the predetermined condition and the magnetic induction signal has a high voltage, the first switch K1 1410 is turned on, the second switch K2 1420 is turned off, and the third switch K3 1430 is turned on. Accordingly, the first current path is on and the second current path is off. As a result, the output control circuit 1120 controls the magnetic sensor 1105 to operate in the first state. Namely, the electrical (load) current flows from the VDD 1407 through the first switch K1 1410, the third switch K3 1430, and finally out of the output port B 1106.

When the magnetic sensor 1105 satisfies the predetermined condition and the magnetic induction signal has a low voltage, the first switch K1 1410 is turned off, the second switch K2 1420 is turned on, and the third switch K3 1430 is turned on. Accordingly, the first current path is off and the second current path is on. As a result, the output control circuit 1120 may control the magnetic sensor 1105 to operate in the second state. Namely, the electrical (load) current flows into the output port B 1106, through the third switch K3 1430, and the second switch K2 1420, to the ground.

When the magnetic sensor 1105 does not satisfies the predetermined condition, the third switch K3 1430 is turned off. Accordingly, neither the first current path nor the second current path is on. As a result, the output control circuit 1120 may control the magnetic sensor 1105 to operate in the third state, no matter whether the magnetic induction signal 1405 has a high voltage or a low voltage. Namely, no electrical (load) current flows through the output port B 1106 (or only a small amount of current flows through the output port B compared with the electrical (load) current above, e.g., the current is less than one fourth of the electrical (load) current and cannot drive a load outside the magnetic sensor 1105). As such, the output control circuit 1120 does not respond to the magnetic induction signal 1405.

Figure 15:
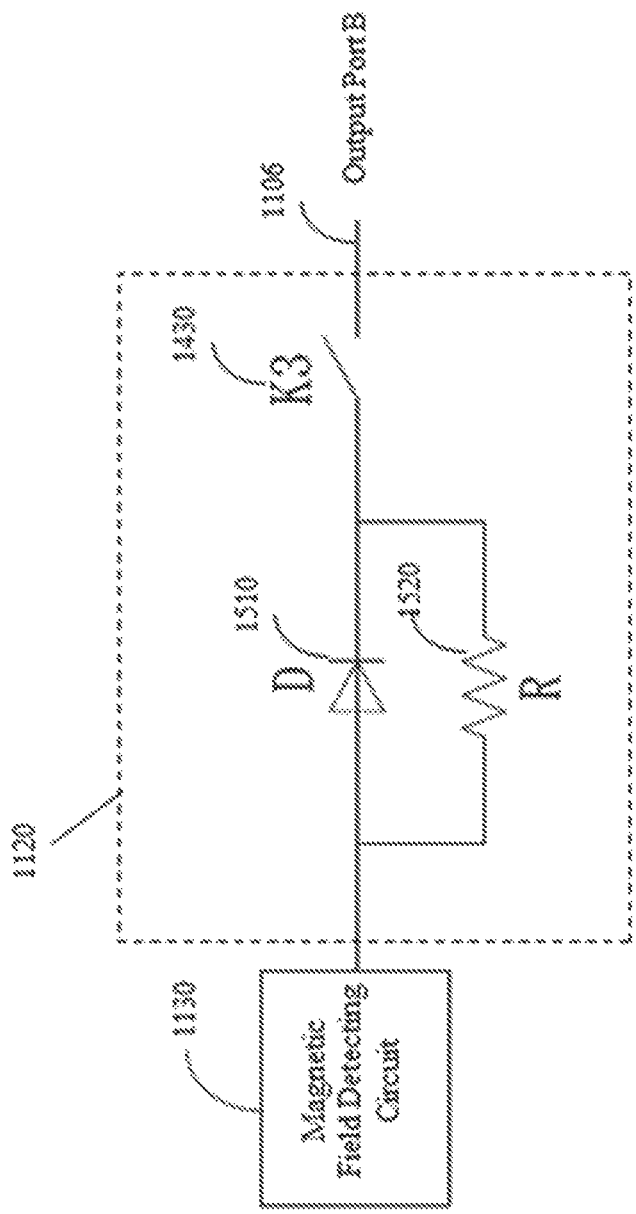
FIG. 15 illustrates an exemplary implementation of the output control circuit 1120 according to another embodiment of the present teaching.

FIG. 15 illustrates an exemplary implementation of the output control circuit 1120 according to another embodiment of the present teaching. As shown, the output control circuit 1120 is coupled with the magnetic field detecting circuit 1130. The output control circuit 1120 receives the magnetic induction signal 1405 (as shown in FIG. 14) from the magnetic field detecting circuit 1130. The output control circuit 1120 includes a single-conducting switch D 1510, a resistor R 1520, and the third switch K3 1430. The single-conducting switch D 1510 is coupled with the output port B 1106 through the third switch K3 1340, forming a first current path allowing the load current to flow in a first direction. On the other hand, the resistor R 1520 is coupled with the output port B 1106 through the third switch K3 1430, forming a second current path allowing the load current to flow in a second direction opposite to the first direction. When the magnetic sensor 1105 satisfies the predetermined condition, the third switch K3 1430 may be turned on. Otherwise, the third switch K3 1530 may be turned off. Details on how to control the on/off of the third switch is discussed with respect to FIG. 18. The single-conducting switch D 1510 may be selectively turned on or off based on the magnetic induction signal 1405 received from the magnetic field detecting circuit 1130. For example, when the magnetic induction signal 1405 has a high voltage, the single-conducting switch D 1510 is turned on. When the magnetic induction signal 1405 has a low voltage, the single-conducting switch D 1510 is turned off. In another embodiment, the resistor R 1520 may be replaced by another single-conducting switch connected anti-parallel with the single-conducting switch D 1510.

As described above, when the magnetic sensor 1105 satisfies the predetermined condition and the magnetic induction signal 1405 received from the magnetic field detecting circuit 1130 has a high voltage, both the single-conducting switch D 1510 and the third switch K3 1430 are turned on. Accordingly, the first current path is on and the second current path is off. As a result, the output control circuit 1120 may control the magnetic sensor 1105 to operate in the first state. Namely, the electrical (load) current flows out of the output port B 1106 through the single-conducting switch D 1510 and the third switch K3 1530.

When the magnetic sensor 1105 satisfies the predetermined condition and the magnetic induction signal 1405 received from the magnetic field detecting circuit 1130 has a low voltage, the single-conducting switch D 1510 is turned off and the third switch K3 1430 is turned on. Accordingly, the first current path is off. As the magnetic induction signal is low, and the third switch K3 1430 is on, the second current path is conducting. As a result, the output control circuit 1120 may control the magnetic sensor 1105 to operate in the second state. Namely, the electrical (load) current flows into the output port B 1106, and through the third switch K3 1530 and the resistor R 1520, respectively.

When the magnetic sensor 1105 does not satisfies the predetermined condition, the third switch K3 1430 is turned off. In this case, neither the first current path nor the second current path is on. As a result, the output control circuit 1120 may control the magnetic sensor 1105 to operate in the third state no matter whether the magnetic induction signal 1405 has a high voltage or a low voltage. Namely, no electrical (load) current flows through the output port B 1106. As such, the output control circuit 1120 does not respond to the magnetic induction signal 1405.

Figure 16:
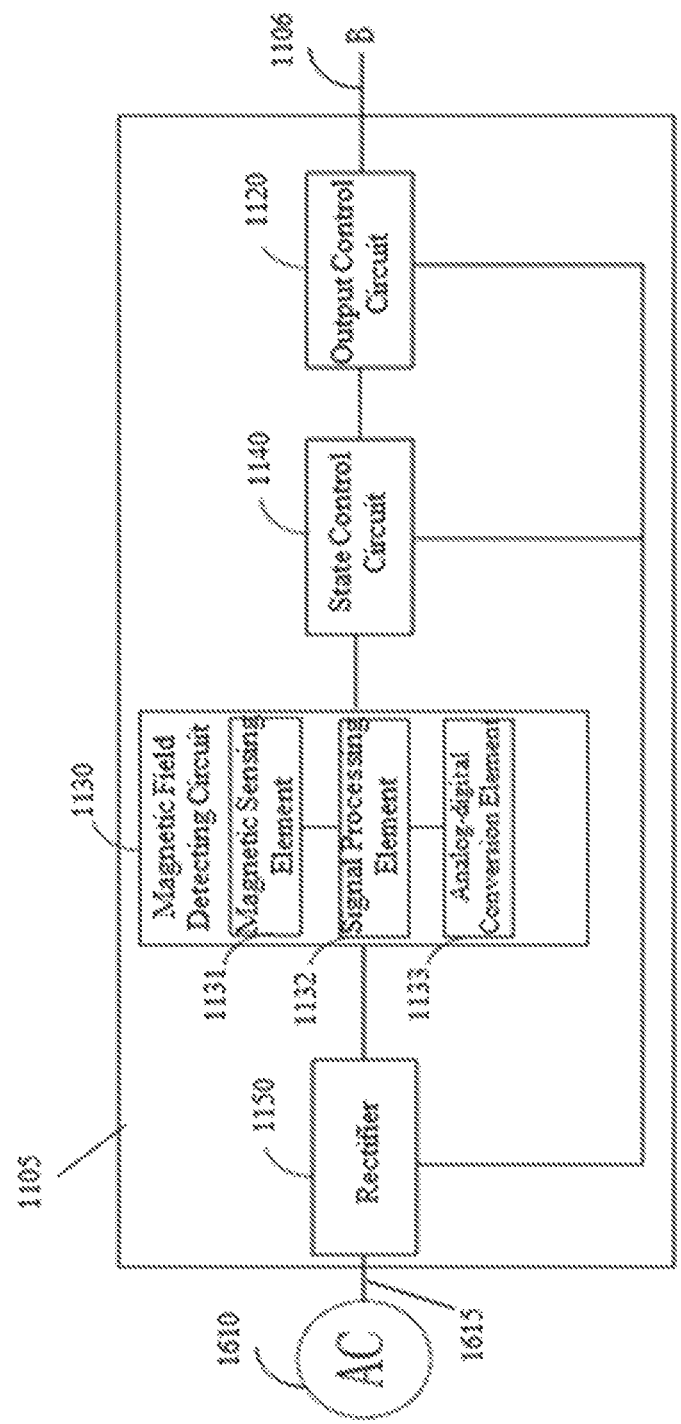
FIG. 16 illustrates another exemplary diagram of the magnetic sensor 1105 according to yet another embodiment of the present teaching.

FIG. 16 illustrates another exemplary diagram of the magnetic sensor 1105 according to yet another embodiment of the present teaching. As shown, the input 1615 of the magnetic sensor 1105 is connected to an external AC power supply 1610. In this embodiment, the magnetic sensor 1105 includes a rectifier 1150 connected to the input 1615 and configured to receive a pair of differential AC signals from the external AC power supply 1610 and convert the pair of differential AC signals to direct current (DC) signals. The output voltage of the rectifier 1150 may be used to power up the magnetic field detecting circuit 1130, the state control circuit 1140, and the output control circuit 1120. The magnetic sensor 1105 may further comprise the magnetic detecting circuit 1130, the state control circuit 1140, and the output control circuit 1120, as described above.

Figure 17:
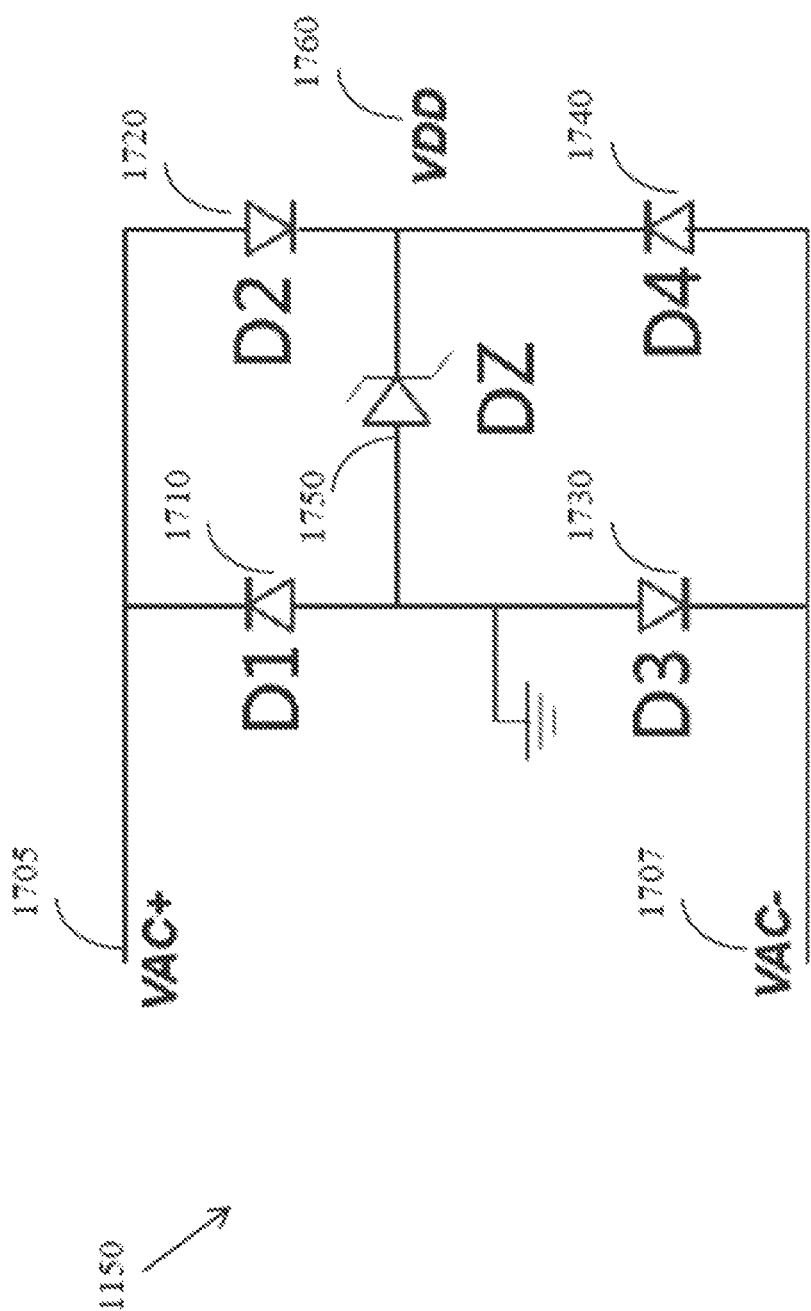
FIG. 17 illustrates an exemplary diagram of the rectifier 1150 according to an embodiment of the present teaching.

FIG. 17 illustrates an exemplary diagram of the rectifier 1150 according to an embodiment of the present teaching. The rectifier 1150 includes a full wave rectifier bridge and a stabilizing unit connected to the full wave rectifier. The full wave rectifier bridge includes a first diode D1 1710, a second diode D2 1720, a third diode D3 1730, and a fourth diode D4 1740. As shown in FIG. 17, the first diode D1 1710 is connected in series to the second diode D2 1720, and the third diode D3 1730 is connected in series to the fourth diode D4 1740. The output of the first diode D1 1710 and the input of the second diode D2 1720 are connected to the first input port VAC+ 1705, and the output of the third diode D3 1730 and the input of the fourth diode D4 1740 are connected to the second input port VAC− 1707. In an embodiment, the first input port VAC+ 1705 and the second input port VAC− 1707 are a pair of differential AC signals. The full wave rectifier bridge may be configured to convert the pair of differential AC signals outputted by the AC power supply 1610 to direct signals. The stabilizing unit may be a Zener diode DZ 1750 and configured to stabilize the direct signals outputted by the full wave rectifier bridge within a predetermined range. The stabilizing unit outputs a stabilized DC voltage.

In an embodiment, the input of the first diode D1 1710 is connected to the input of the third diode D3 1730 at a first connection point, thereby forming the grounded port of the full wave rectifier bridge. In addition, the output of the second diode D2 1720 is connected to the output of the fourth diode D4 1740 at a second connection point, thereby forming the output port of the full wave rectifier bridge, VDD 1760. The Zener diode DZ 1750 is situated between the first connection point and the second connection point. In an embodiment, the output VDD 1760 may be connected directly with the output control circuit 1120.

In an embodiment, the first input port VAC+ 1705 and the second input port VAC− 1707 are connected to the external AC power supply 1610. In this case, the output control circuit 1120 may respond to the polarity of the external AC power supply 1610 in addition to the magnetic induction signal 1405.

In an embodiment, whether the magnetic sensor 1105 operates in the first state, the second state, or the third state, depends on whether the magnetic sensor 1105 satisfies the predetermined condition, which may be determined according to a user's specification. Accordingly, the output control circuit 1120 may control the magnetic sensor 1105 to operate in the first state that the electrical (load) current may flow out of the output port B 1106 or in the second state that the electrical (load) current may flow into the output port B 1106. Alternatively or additionally, when the magnetic sensor 1105 satisfies the predetermined condition, the output control circuit 1120 may control the magnetic sensor 1105 to operate alternately between the first state and the second state in response to the polarity of the external AC power supply 1610 and the polarity of the magnetic field indicated by the magnetic induction signal 1405. When the magnetic sensor 1105 does not satisfy the predetermined condition, the output control circuit 1120 may control the magnetic sensor 1105 to operate in the third state that no electrical (load) current may flow through the output port B 1106 or only a small amount of current flows through the output port B compared with the electrical (load) current above, e.g., the intensity of the current is less than one fourth of the electrical (load) current.

In an embodiment, when the magnetic sensor 1105 satisfies the predetermined condition, the output control circuit 1120 may respond to both the magnetic induction signal and the external AC power supply 1610 to further control the magnetic sensor 1105 to operate in the first state or the second state. For example, when the magnetic sensor 1105 satisfies the predetermined condition and the magnetic induction signal 1405 indicates that the external magnetic field has the first magnetic polarity and the external AC power supply 1610 has the first electric polarity, the output control circuit 1120 may control the magnetic sensor 1105 to operate in the first state. For another example, when the magnetic sensor 1105 satisfies the predetermined condition and the magnetic induction signal 1405 indicates that the external magnetic field has the second magnetic polarity which is opposite to the first magnetic polarity and the AC power supply 1610 has the second electric polarity which is opposite to the first electric polarity, the output control circuit 1120 may control the magnetic sensor 1105 to operate in the second state.

Figure 18:
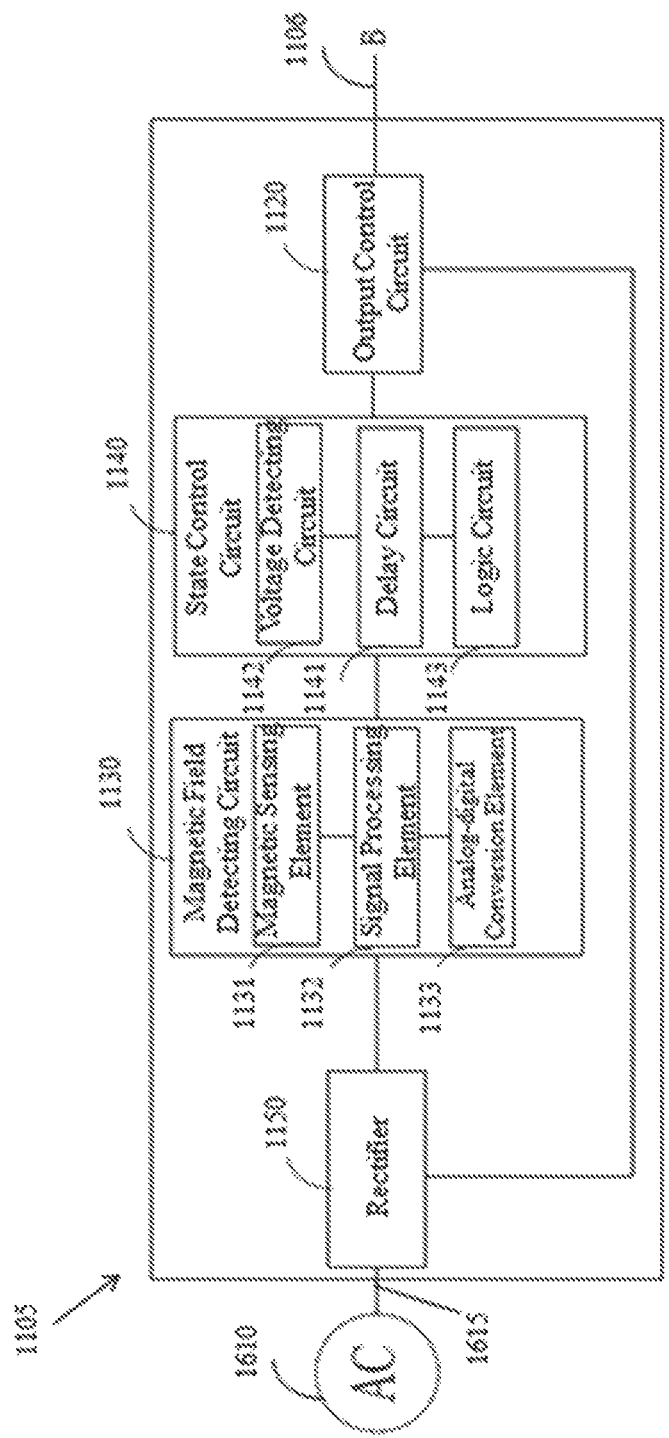
FIG. 18 illustrates an exemplary diagram of the magnetic sensor 1105 according to yet another embodiment of the present teaching.

FIG. 18 illustrates an exemplary diagram of the magnetic sensor 1105 according to yet another embodiment of the present teaching. In this exemplary embodiment, an exemplary construction of the state control circuit 1140 is provided. As shown, the input 1615 of the magnetic sensor 1105 is connected to an external AC power supply 1610. As shown before, the magnetic sensor 1105 includes a rectifier 1150 connected to the input 1615 and configured to receive a pair of differential AC signals from the external AC power supply 1610 and convert the pair of differential AC signals to direct current signals. The magnetic sensor 1105 further comprises the magnetic detecting circuit 1130, the state control circuit 1140, and the output control circuit 1120. As shown in FIG. 18, the state control circuit 1140 further comprises a voltage detecting circuit 1142, a delay circuit 1141, and a logic circuit 1143.

The voltage detecting circuit 1142 may be configured to detect whether a voltage in the magnetic sensor 1105 equals to or exceeds a threshold voltage. When the voltage exceeds the threshold voltage, the voltage detecting circuit 1142 generates a predetermined trigger signal and transmits it to the delay circuit 1141. In an embodiment, the voltage may be the supply voltage of the magnetic field detecting circuit 1130. The threshold voltage may be the minimal voltage required for the operation of the magnetic sensing element 1131, the signal processing element 1132, and the analog-digital conversion element 1133 of the magnetic field detecting circuit 1130. In an embodiment, the threshold voltage may set to be a value that is smaller than the stabilized DC voltage achieved by the stabilizing unit as described with respect to FIG. 17.

Once being triggered by the voltage detecting circuit 1142, the delay circuit 1141 determines whether the magnetic sensor 1105 satisfies the predetermined condition. Specifically, the delay circuit 1141 may start to time, upon the receipt of the predetermined trigger signal from the voltage detecting circuit 1142. When the timed period is equal to or longer than a predetermined length of period, the delay circuit 1141 determines that the magnetic sensor 1105 satisfies the predetermined condition. Otherwise, the delay circuit 1141 determines that the magnetic sensor 1105 does not satisfy the predetermined condition.

The logic circuit 1143 may be configured to enable the output control circuit 1120 to respond to the magnetic induction signal and control the magnetic sensor 1105 to operate in any of the three states in the manner as discussed herein. For example, the magnetic sensor will operate in the first state or the second state when the timed period recorded by the delay circuit 1141 is equal to or greater than the predetermined period. The logic circuit 1143 is further configured to enable the output control circuit 1120 to control the magnetic sensor 1105 to operate in the third state when the timed period recorded by the delay circuit 1141 is less than the predetermined period.

In an embodiment, to detect that the supply voltage of the magnetic field detecting circuit 1130 reaches the predetermined voltage threshold is to ensure that all the modules of the magnetic field detecting circuit 1130, i.e., the magnetic sensing element 1131, the signal processing element 1132, and the analog-digital conversion element 1133, may function normally.

Figure 19:
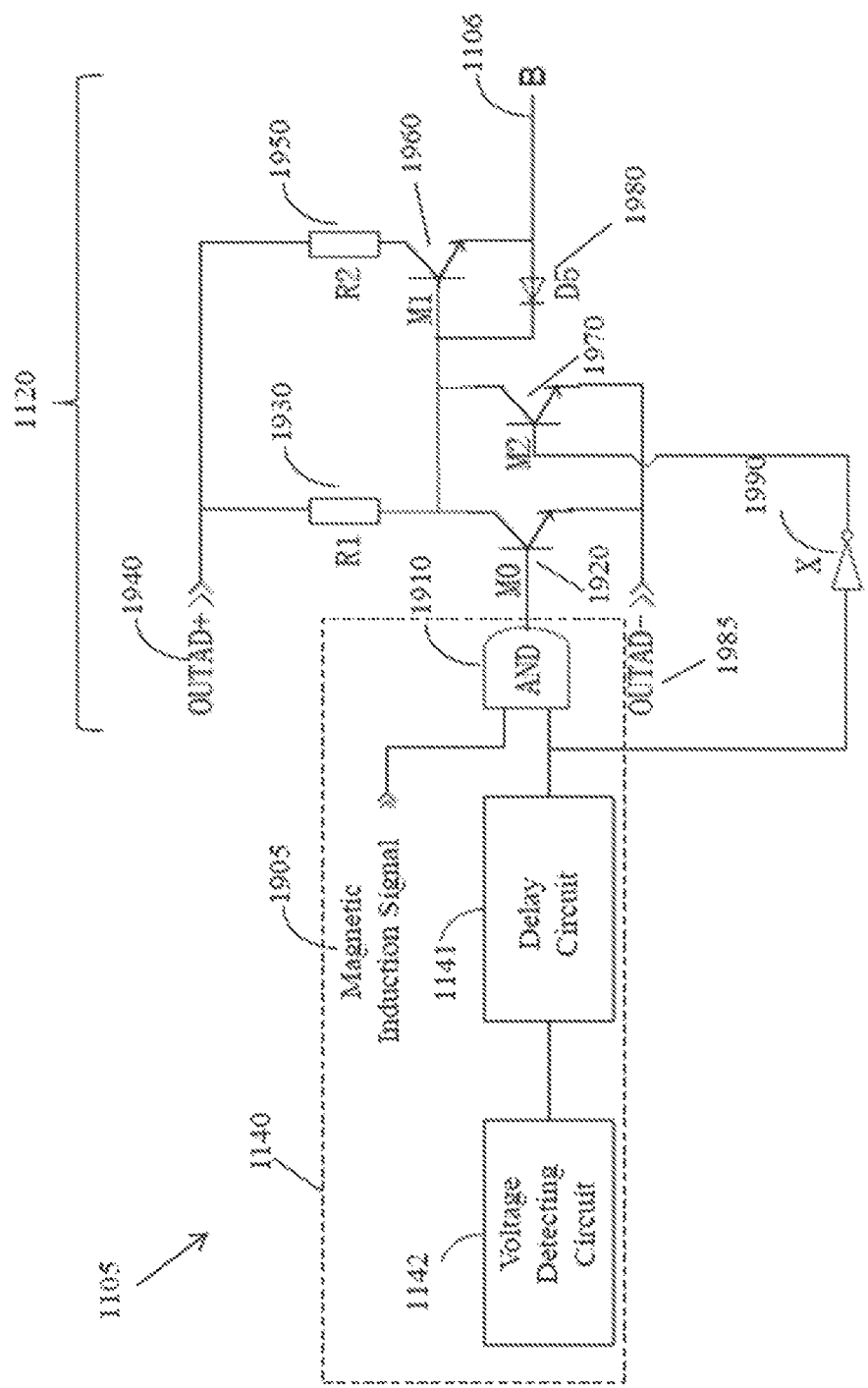
FIG. 19 illustrates an exemplary implementation circuit of a part of the magnetic sensor 1105 according to yet another embodiment of the present teaching.

FIG. 19 illustrates an exemplary implementation circuit of a part of the magnetic sensor 1105 according to yet another embodiment of the present teaching. Specifically, FIG. 19 illustrates an exemplary implementation of the output control circuit 1120 and the state control circuit 1140. The state control circuit 1140 includes the voltage detecting circuit 1142, the delay circuit 1141, and the logic circuit 1143, which is an AND gate 1910 as shown in FIG. 19. A first input of the AND gate 1910 may correspond to the magnetic induction signal 1905, a second input of the AND gate 1910 may be connected to an output of the delay circuit 1141, and the output of the AND gate 1910 may be connected to the output control circuit 1120.

In this embodiment, the output control circuit 1120 includes three high-voltage conducting switches M0 1920, M1 1960, M2 1970, a diode D5 1980, an inverter 1990, a first resistor R1 1930, and a second resistor R2 1950. The control terminal of the switch M0 1920 is connected to the output of the AND gate 1910. The input of the switch M0 1920 is connected to a voltage output port 1940 (OUTAD+) of the rectifier 1150 through the resistor R1 1930. The switch M2 1970 is coupled in parallel with the switch M0 1920. The control terminal of the switch M2 1970 is connected to the output of the delay circuit 1141 through the inverter 1990. In an embodiment, the equivalent resistance of the switch M2 1970 is greater than that of the switch M0 1920.

In operation, when the timed period recorded by the delay circuit 1141 is equal to or longer than the predetermined threshold period, the delay circuit 1141 outputs a high voltage. Accordingly, this high voltage allows the magnetic induction signal 1905 from the magnetic field detecting circuit 1130 is transmitted to the switch M0 1920 through the AND gate 1910. In addition, when the signal from the AC power supply 1610 is in the positive half cycle and the magnetic induction signal 1905 from the magnetic field detecting circuit 1130 outputs low voltage, the switch M0 1920 and the switch M2 1970 may be turned off, and the switch M1 1960 may be turned on. As a result, the electrical (load) current may flow out of the output port B 1106 through the switch M1 1960. Namely, the output control circuit 1120 operates the magnetic sensor 1105 in the first state. Alternatively, when the signal from the AC power supply 1610 is in the negative half cycle and the magnetic induction signal 1905 from the magnetic field detecting circuit 1130 outputs high voltage, the switch M0 1920 may be turned on, and the switches M1 1960 and M2 1970 may be turned off. As a result, the electrical (load) current may flow into the output port B 1106 and pass through the diode D5 1980 and the switch M0 1920. Namely, the output control circuit 1120 may control the magnetic sensor 1105 to operate in the second state.

When the timed period recorded by the delay circuit 1141 is shorter than the threshold period. The delay circuit 1141 and the AND gate 1910 may output a low voltage, the switches M0 1920 and M1 may be turned off, and the switch M2 1970 may be turned on. As a result, the electrical current flows into the output port B 1106 and passes through the diode D5 1980 and the switch M2 1970. Since the equivalent resistance of the switch M2 1970 is large, the electrical current is very small, or negligible. That is, the output control circuit 1120 controls the magnetic sensor 1105 to operate in the third state.

Figure 20:
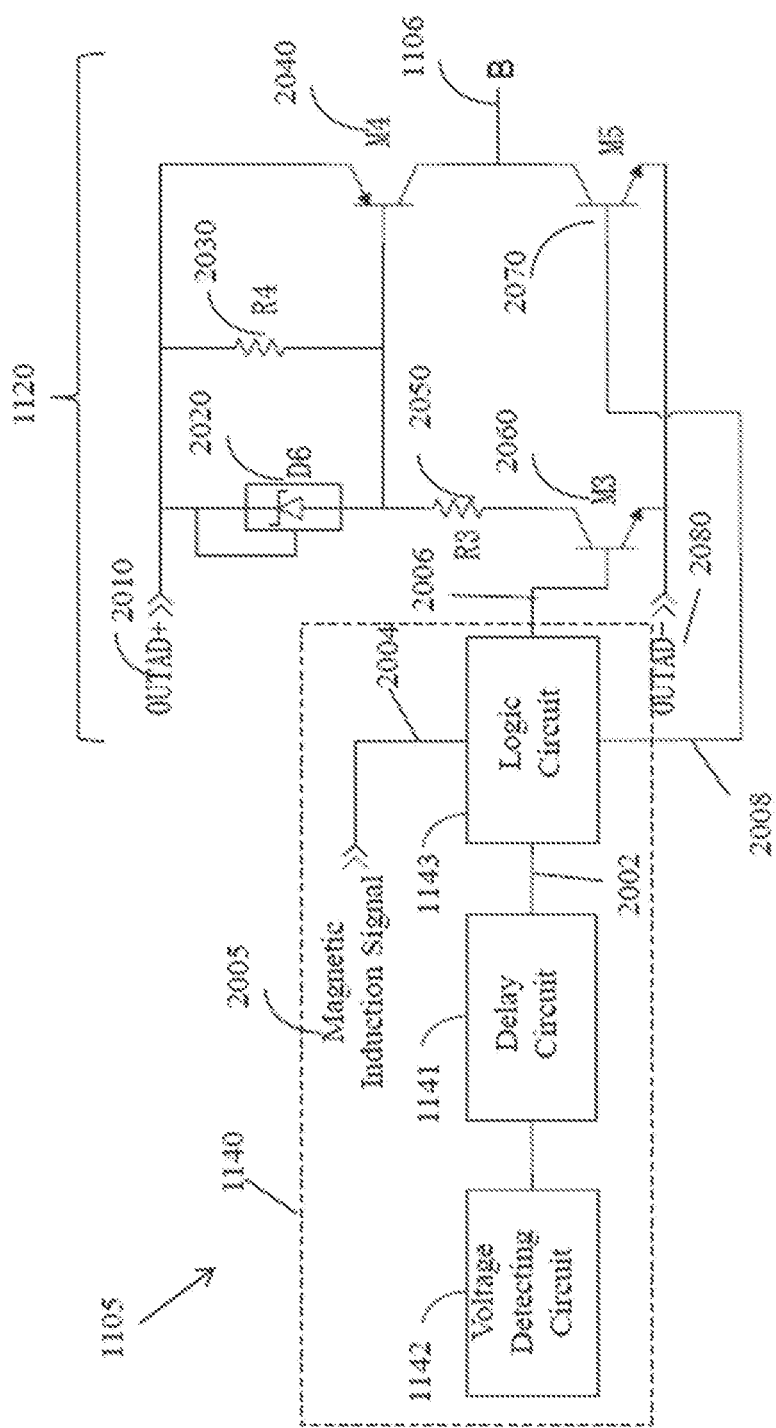
FIG. 20 illustrates another embodiment of the output control circuit 1120 in connection with the state control circuit 1140.

FIG. 20 illustrates another embodiment of the output control circuit 1120 in connection with the state control circuit 1140. The state control circuit 1140 includes the voltage detecting circuit 1142, the delay circuit 1141, and the logic circuit 1143. Specifically, the logic circuit 1143 of the state control circuit 1140 includes a first signal input port 2002, a second signal input port 2004, a first signal output port 2006, and a second signal output port 2008. The first signal input port 2002 may be connected to the output of the delay circuit 1141, and the second signal input port may be connected to receive the magnetic induction signal 2005. When the timed period recorded by the delay circuit 1141 is shorter than the threshold period, the logic circuit 1143 may be configured to output a low voltage as the delay circuit 1141. On the other hand, when the timed period recorded by the delay circuit 1141 is equal to or longer than the threshold period, the delay circuit 1141 may output high voltage. Further, the logic circuit 1143 may output the magnetic induction signal 2005 through the first signal output port 2006 or the second signal output port 2008. The output signals in the first signal output port 2006 and the second signal output port 2008 may have a 180 degree phase difference. It should be appreciated that the output signals in the first output port 2006 and the second output port 2008 cannot have high voltages at the same time.

In this embodiment, the output control circuit 1120 includes three switches, i.e., switches M3 2060, M4 2040, and M5 2070, two resistances, i.e., resistances R3 2050, and R4 2030, and a protecting diode D6 2020. Specifically, the switches M3 2060 and M5 2070 are both high-voltage conducting switches, and the switch M4 2040 is a low-voltage conducting switch. The control terminals of the switch M3 2060 and the switch M5 2070 are connected to the first signal output port 2006 and the second signal output port 2008 of the logic circuit 1143, respectively. The input of the switch M3 2060 is connected to a first port of the resistor R3 2050. The output of the switch M3 2060 is connected to the grounded output (OUTAD− 2080) of the rectifier 1150 (as shown in FIG. 15).

The control terminal of the switch M4 2040 is connected to a second port of the resistor R3 2050. The input of the switch M4 2040 is connected to the voltage output port (OUTAD+ 2010) of the rectifier 1150. The output of the switch M4 2040 is connected to the input of the switch M5 2070. The output of the switch M5 2070 is connected to the voltage output port (OUTAD− 2080) of the rectifier 1150. In an embodiment, the voltage output port (OUTAD− 2080) is a floating ground. The output of the switch M4 2040 is connected to the input of the switch M5 2070 and the output port B 1106. The control terminal of the switch M4 2040 is connected to the positive polarity of the protecting diode D6 2020. The input of the switch M4 2040 is connected to the negative polarity of the protecting diode D6 2020. The resistor R4 2030 is connected between the control terminal and input terminal of the switch M4 2040.

In operation, when the timed period recorded by the delay circuit 1141 is equal to or longer than the threshold period, the delay circuit 1141 outputs a high voltage. In this case, the logic circuit 1143 allows the magnetic induction signal be output through the first signal output port 2006 or the second signal output port 2008. The output signals in the first signal output port 2002 and the second signal output port 2004 may have a 180 degree phase difference. In addition, when the signal from the AC power supply 1610 is in the positive half cycle and the magnetic induction signal 2005 from the magnetic field detecting circuit 1130 corresponds to a high voltage, the switches M3 2060 and M4 2040 may be turned on, the switch M5 2070 may be turned off. As a result, the electrical (load) current flows out of the output port B 1106 through the switch M4 2040. Namely, the output control circuit 1120 controls the magnetic sensor 1105 to operate in the first state. Alternatively, when the signal from the AC power supply 1610 is in the negative half cycle and the magnetic induction signal 2005 from the magnetic field detecting circuit 1130 corresponds to a low voltage, the switches M3 2060 and M4 2040 may be turned off, and the switch M5 2070 may be turned on. As a result, the electrical current flows into the output port B 1106 and passes through the switch M5 2070. Namely, the output control circuit 1120 controls the magnetic sensor 1105 to operate in the second state.

When the timed period recorded by the delay circuit 1141 is shorter than the threshold period, the output control circuit 1120 is designated to control the magnetic sensor 1105 to operate in the third state. In this case, the delay circuit 1141 outputs a low voltage, the logic circuit 1143 outputs a low voltage at each of the first output port 2006 and the second output port 2008, and the switches M3 2060, M4 2040, and M5 2070 may be turned off. As a result, no electrical current flows through the output port B 1106 (or only a small amount of current flows through the output port B compared with the electrical (load) current above, e.g., the current is less than one fourth of the electrical (load) current).

Figure 21:
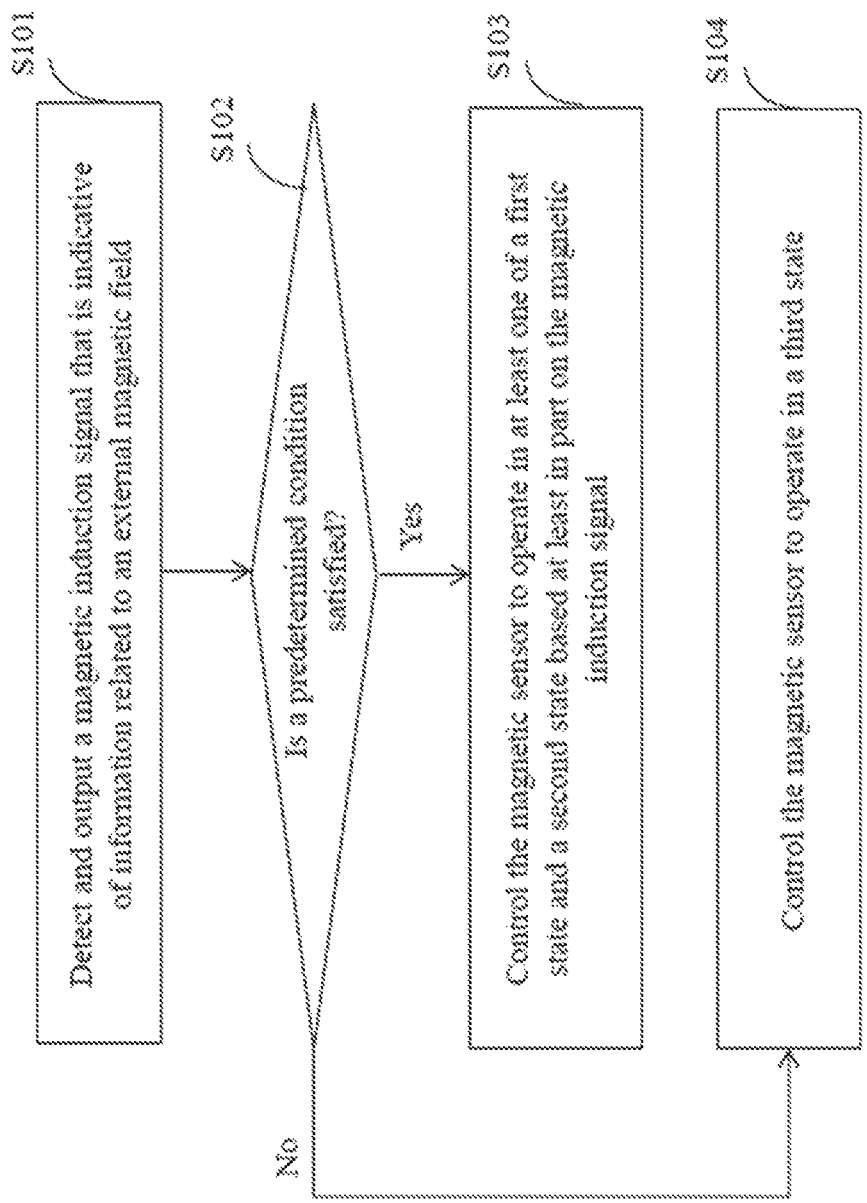
FIG. 21 is a flowchart of an exemplary method of signal processing performed by the magnetic sensor 1105, according to an embodiment of the present teaching.

FIG. 21 is a flowchart of an exemplary method of signal processing performed by the magnetic sensor 1105, according to an embodiment of the present teaching. At step S101, an external magnetic field is detected. A magnetic induction signal may be indicative of the polarity and/or strength of the external magnetic field is generated. Specifically, at step S101, analog electrical signals associated with an external magnetic field and information associated therein are detected and outputted. In addition, the detected analog electrical signal may be processed by amplifying and reducing interference of the analog electrical signal. Further, the processed analog electrical signal may be converted to generate the magnetic induction signal. In some applications, the magnetic induction signal may be a switch digital signal that is indicative of the polarity of the external magnetic field.

At step S102, it is determined whether a predetermined condition is satisfied. The predetermined condition is related or assessed with respect to a specific voltage of the magnetic sensor. If the predetermined condition is met, the method proceeds to step S103. Otherwise, the method proceeds to step S104. Specifically, the predetermined condition may be set as a predetermined period that the voltage of the magnetic sensor reaches the predetermined voltage threshold. In an embodiment, whether the predetermined condition is satisfied may be determined based on the period of time during which the voltage of the magnetic sensor 1105 is equal to or above a predetermined voltage threshold. As discussed herein, to perform step S102, it is determined whether the voltage of the magnetic sensor 1105 reaches the predetermined voltage threshold. If so, the delay circuit 1141 starts to time. If the timed period reaches a predetermined length, it is determined that the predetermined condition is satisfied. Otherwise, it is determined that the predetermined condition is not satisfied.

At step S103, based on the magnetic induction signal, the magnetic sensor is controlled to operate in at least one of a first state and a second state. As discussed herein, in the first state, an electrical (load) current flows out of the output port B 1106. In the second state, the electrical (load) current flows into the output port B 1106. At step S104, the magnetic sensor is controlled to operate in a third state, in which the magnetic sensor 1105 operates in neither the first state nor the second state, i.e., no current (or negligible) flows through the output port B 1106.

Figure 22:
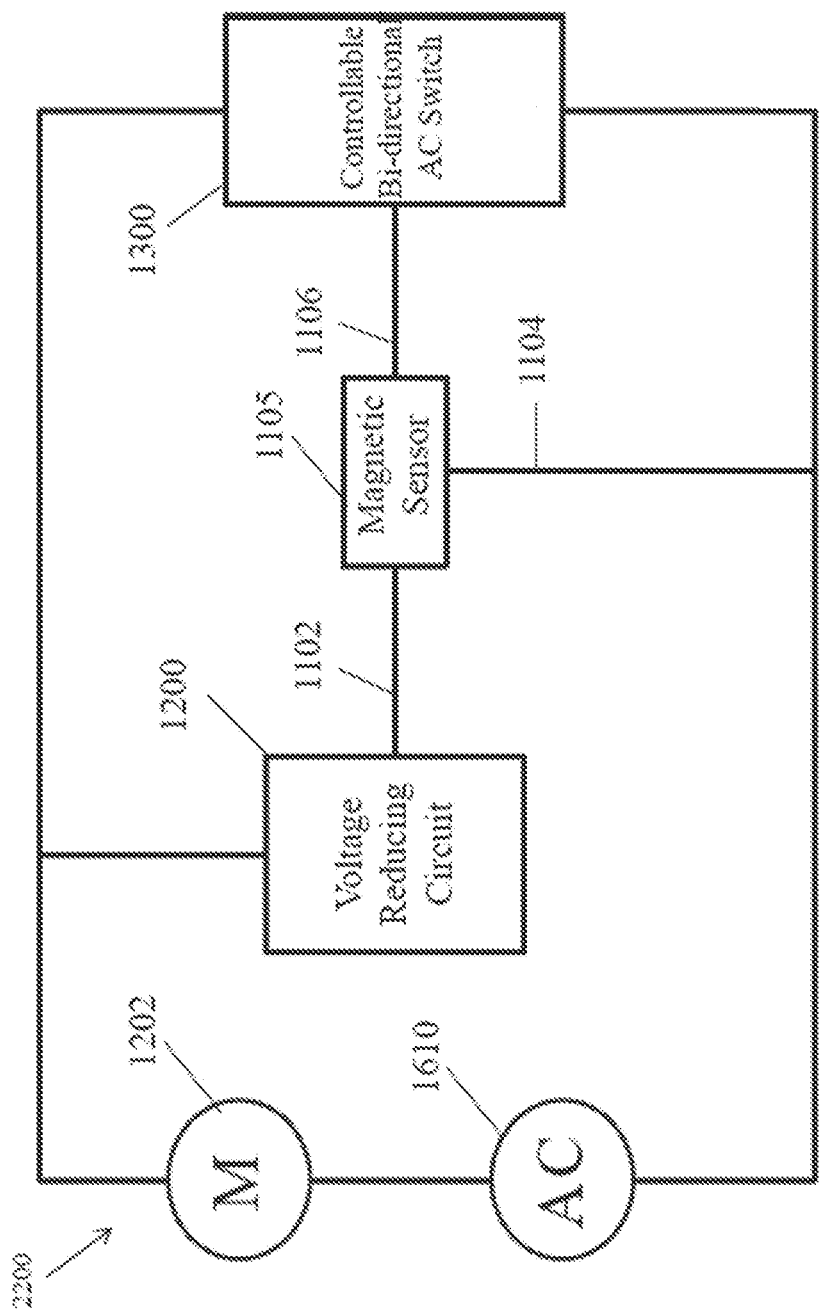
FIG. 22 illustrates an exemplary diagram of a motor assembly 2200 incorporating the magnetic sensor discussed herein, according to an embodiment of the present teaching.

FIG. 22 illustrates an exemplary diagram of a motor assembly 2200 incorporating the magnetic sensor discussed herein, according to an embodiment of the present teaching. The motor assembly 2200 comprises a motor M 1202 coupled with an external AC power supply 1610, a controllable bi-directional AC switch 1300 coupled in series with the motor M 1202, and the magnetic sensor 1105. The magnetic sensor 1105 resides close to the rotor of the motor 1202 in order to detect the variation of the magnetic field near the rotor.

In an embodiment, the magnetic sensor 1105 includes a first input 1102 coupled to the motor 1202, a second input 1104 coupled to the external AC power supply 1610, and the output 1106 coupled to a control terminal of the controllable bi-directional AC switch 1105.

In an embodiment, the motor assembly 2200 may further comprise a voltage reducing circuit 1105, configured to e.g., provide a reduced voltage obtained based on the AC power supply 1610, to the magnetic sensor 1105. In this embodiment, the first input 1102 of the magnetic sensor 1105 is instead coupled to the voltage reducing circuit 1200.

Figure 23:
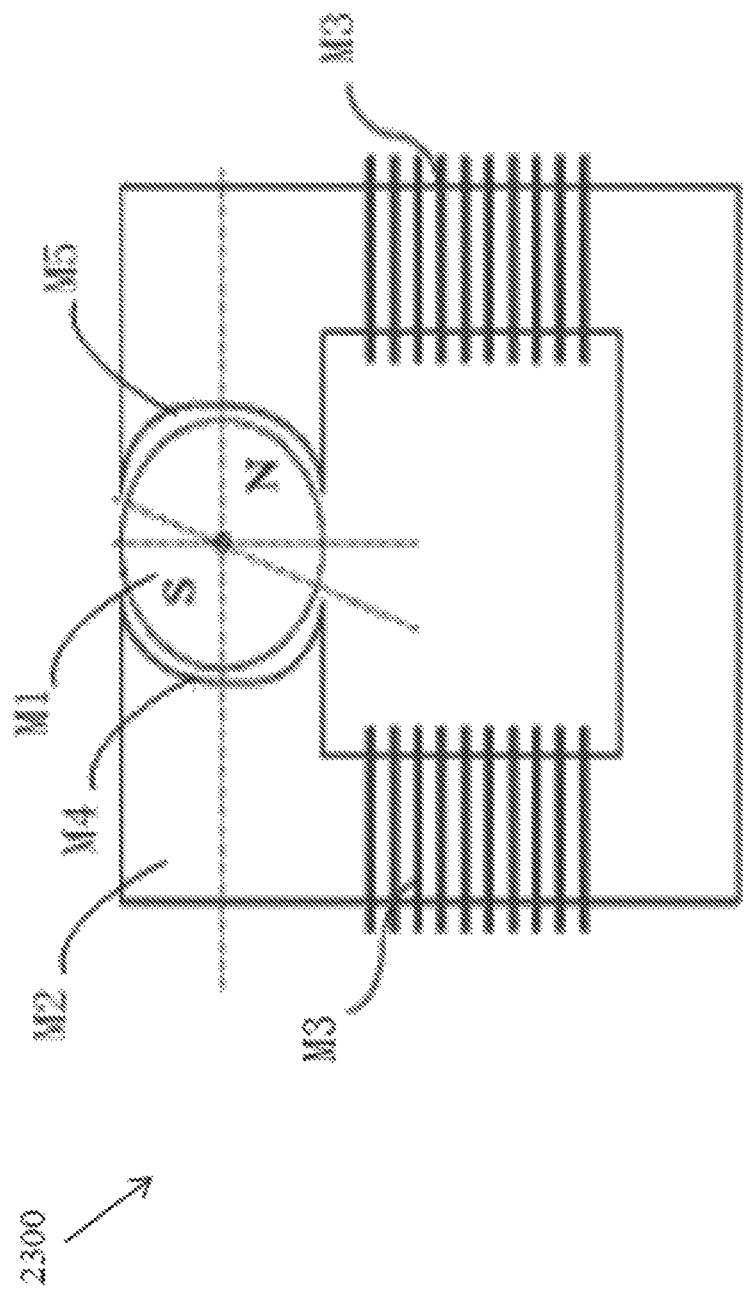
FIG. 23 illustrates an exemplary diagram of a motor 2300 according to an embodiment of the present teaching.

FIG. 23 illustrates an exemplary diagram of a motor 2300 according to an embodiment of the present teaching. The motor 2300 may be similar to the motor 1202 in FIG. 22. In an embodiment, the motor 2300 is a synchronous motor including a stator and a rotor M1 rotating around the stator. The stator includes a stator core M2 and a single phase winding M3 winding around the stator core M2. The stator core M2 may include pure iron, cast iron, cast steel, electrical steel, silicon steel, or any other soft magnetic materials. The rotor M1 includes a permanent magnet. When the stator winding M3 is coupled in series with the AC power supply 1610, the rotor M1 may operate at a uniform speed of 60 f/p revolution/minute (rmp) in the stable phase, where f is the frequency of the AC power supply 1610, and p is the number of pole pairs of the rotor M1. The stator core M2 has two opposite polarities, either of which has a pole arc (e.g., M4, M5). The outer surface of the rotor M1 is opposite to the pole arc (e.g., M4, M5), thereby forming a non-uniform gap between the outer surface and the pole arc. The pole arcs (e.g., M4, M5) of the stator poles are embedded with concave grooves. The portion of the pole arc other than the concave groove has the same center axis as the rotor M1.

A non-uniform magnetic field may be formed in the above configuration, which ensures that the polar of the rotor M1 is relative to the center axis of the stator pole with an angle when the rotor M1 is static. The angle ensures an initial torque for the rotor M1 every time the motor M is powered up under the influence of the magnetic sensor 1105. The polar of the rotor M1 may be the boundary between the opposite magnetic polarities of the rotor M1. The center axis of the stator may be a line passing through the centers of the poles of the stator. In an embodiment, both the stator and the rotor M1 have two magnetic polarities. In an embodiment, the stator and the rotor M1 may have a greater number of magnetic polarities, e.g., four or six magnetic polarities.

Returning to FIG. 22, when the magnetic sensor 1105 satisfies the predetermined condition, the magnetic sensor 1105 may operate in either the first state or the second state depending on the signal from the AC power supply 1610 and the polarity of the permanent magnetic rotor M1. Specifically, when the signal from the AC power supply 1610 is in the positive half cycle and the magnetic field detecting circuit 1130 detects that the permanent magnetic rotor M1 has a first polarity, the output control circuit 1120 controls the magnetic sensor 1105 to operate in the first state. Namely, an electrical current may flow from the magnetic sensor 1105 to the controllable bi-directional AC switch 1300. Alternatively, when the signal from the AC power supply 1610 is in the negative half cycle and the magnetic field detecting circuit 1130 detects that the permanent magnetic rotor M1 has a second polarity that is opposite to the first polarity, the output control circuit 1120 controls the magnetic sensor 1105 to operate in the second state, in which, the electrical current may flow from the controllable bi-directional AC switch 1300 to the magnetic sensor 1105.

When the magnetic sensor 1105 does not satisfy the predetermined condition, the magnetic sensor 1105 operates in the third state, in which, no electrical current flows between the controllable bi-directional AC switch 1300 and the magnetic sensor 1105 (or only a small amount of current flows between the controllable bi-directional AC switch 1300 and the magnetic sensor 1105).

In an embodiment, the magnetic sensor 1105 includes the rectifier 1150 as shown in FIG. 17 and the output control circuit 1120 as shown in FIG. 14. As described above, in FIG. 14, the output control circuit 1120 includes the first switch K1 1410 which is a high-voltage conducting switch, the second switch K2 1420 which is a low-voltage conducting switch, and the third switch K3 1430. When the predetermined condition is met, the third switch K3 1430 is turned on. In addition, when the signal from the AC power supply 1610 is in the positive half cycle and the magnetic induction signal is a high voltage, the first switch K1 1410 is turned on and the second switch K2 1420 is turned off. As a result, the magnetic sensor 1105 operates in the first state, in which, the electrical current flows from the AC power supply 1610, through the motor M 1202, voltage reducing circuit 1105, the first input port of the magnetic sensor 1105, the voltage output port of the second diode D2 in the full wave rectifier bridge, the first switch K1 1410 of the output control circuit 1120, the output port B 1106, then the controllable bi-directional AC switch 1105, finally back to the AC power supply 1610. Alternatively, when the signal from the AC power supply 1610 is in the negative half cycle and the magnetic induction signal is a low voltage, the first switch K1 1410 is turned off and the second switch K2 1420 is turned on. As a result, the magnetic sensor 1105 operates in the second state, in which, the electrical current flows from the AC power supply 1610, through the controllable bi-directional AC switch 1105, the output port B 1106, the second switch K2 1420, the grounded port of the full wave rectifier bridge, the first diode D1 1710, the first input port of the magnetic sensor 1105, the voltage reducing circuit 1105, the motor 1202, and finally back to the AC power supply 1610.

When the signal from the AC power supply 1610 is in the positive half cycle and the magnetic field detecting circuit 1130 outputs a low voltage, or when the signal from the AC power supply 1610 is in the negative half cycle and the magnetic field detecting circuit 1130 outputs a high voltage, neither the first switch K1 1410 nor the second switch K2 1420 can be turned on. Therefore, the output control circuit 1120 operates the controllable bi-directional AC switch 1105 alternately between "ON" and "OFF" states in a predetermined manner. The output control circuit 1120 may further enable the magnetic sensor 1105 to control the way of powering up the stator winding M3 based on the variation of the polarity of the AC power supply 1610 and the magnetic detection information, rendering the varying magnetic field generated by the stator to rotate along with the rotor in a single direction in accordance with the position of the magnetic field of the rotor. This enables that the rotor M1 to rotate in the fixed direction every time the motor 1202 is powered up.

On the other hand, when the magnetic sensor 1105 does not satisfy the predetermined condition, the third switch K3 1430 is turned off. As a result, the magnetic sensor 1105 operates in the third state, in which, no electrical current flows in the motor assembly 2200 (or only a small negligible amount of current flows in the motor assembly 2200) compared with the electrical current above, e.g., the intensity of the current is less than one fourth of the electrical current.

Figure 24:
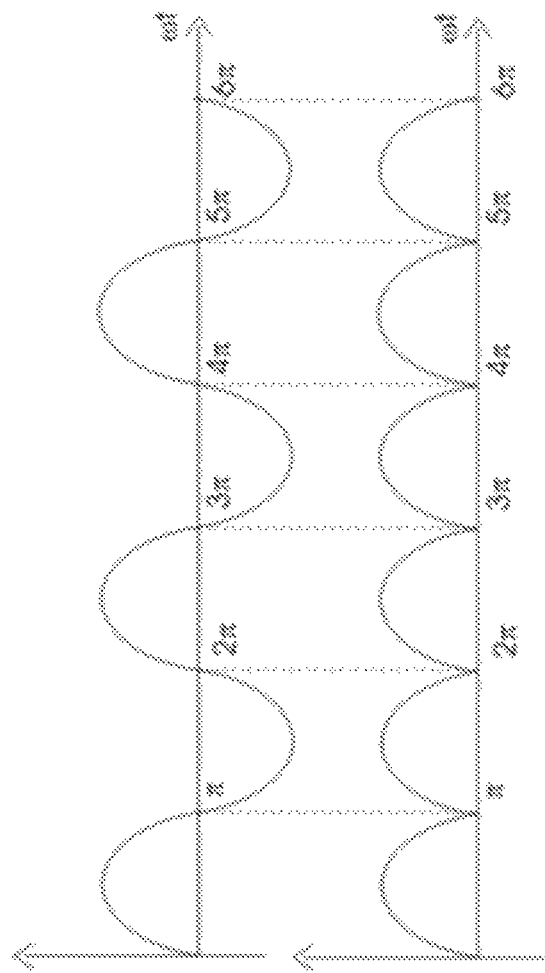
FIG. 24 illustrates the waveforms of an output voltage from an AC power supply 1610 and the rectifier bridge 1150, respectively, according to an embodiment of the present teaching.

FIG. 24 illustrates the waveforms of an output voltage from an AC power supply 1610 and the rectifier bridge 1150, respectively, according to an embodiment of the present teaching. Specifically, the upper portion of FIG. 24 illustrates the waveform of the output voltage from the AC power supply 1610, and the lower portion of FIG. 24 illustrates the waveform of the output voltage of the rectifier bridge 1150. As shown, the frequency of the output voltage of the rectifier bridge is twice of the frequency of the AC power supply 1610.

When the waveform of the output voltage of the rectifier bridge 1150 rises, the output control circuit 1120 may operate in the third state before the output control circuit 1120 operates in the first state or the second state. Accordingly, when the waveform of the output voltage of the AC power supply 1610 is in the positive half cycle, the magnetic sensor 1105 may operate in the first state. When the waveform of the output voltage of the AC power supply 1610 is in the negative half cycle, the magnetic sensor 1105 may operate in the second state. Therefore, the operating frequency of the third state is positively proportional to the operating frequency of the first state or the second state, and is also proportional to the frequency of voltage of the AC power supply 1610. In an embodiment, the operating frequency of the third state is twice of the operating frequency of the first state or the second state, which is twice of the frequency of the AC power supply 1610.

It should be appreciated that the examples described above are for illustrative purpose. The present teaching is not intended to be limiting. The magnetic sensor 1105 may be used in applications other than the motor assembly 2200 as described above.

Returning to FIG. 22, in an embodiment, the motor 1202 and the controllable bi-directional AC switch 1300 may be coupled in series with each other and form a first branch. The series-connected voltage reducing circuit 1200 and the magnetic sensor 1105 form a second branch. The first branch is coupled in parallel with the second branch between two ends of the external AC power supply 1610.

Those skilled in the art will recognize that the present teachings are amenable to a variety of modifications and/or enhancements. For example, although the implementation of various components described above may be embodied in a hardware device, it can also be implemented as a software only solution—e.g., an installation on an existing server. In addition, the units of the host and the client nodes as disclosed herein can be implemented as a firmware, firmware/software combination, firmware/hardware combination, or a hardware/firmware/software combination.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

We claim:

1. A magnetic sensor, comprising:
   a housing;
   an input port and an output port, both extending from the housing, wherein the input port is to be connected to an external alternating current (AC) power supply; and
   an electrical circuit which comprises:
      an output control circuit coupled with the output port and configured to be at least responsive to a magnetic induction signal and, when a predetermined condition is satisfied, to control the magnetic sensor to operate in at least one of a first state and a second state, the predetermined condition being set as a predetermined period that a voltage of the magnetic sensor reaches a predetermined voltage threshold, wherein:
         in the first state, a load current flows in a first direction from the output port to outside of the magnetic sensor,
         in the second state, a load current flows in a second direction opposite that of the first direction from outside of the magnetic sensor into the magnetic sensor via the output port, and
         an operating frequency of the magnetic sensor is positively proportional to a frequency of the external AC power supply; and
      a sub-circuit configured to determine whether the predetermined condition is satisfied, the sub-circuit further comprising:
         a voltage detecting circuit configured to detect a specific voltage and, when the specific voltage equals to or is greater than a predetermined voltage threshold, output a triggering signal;
         a delay circuit coupled with the voltage detecting circuit and configured to time, upon receiving the triggering signal, a length of time during which the specific voltage equals to or is greater than the predetermined voltage threshold; and
         a logic circuit coupled with the delay circuit and configured to:
            signal that the predetermined condition is satisfied, when the length of time exceeds a predetermined length of time, and
            signal that the predetermined condition is not satisfied, when the length of time does not exceed the predetermined length of time.

2. The magnetic sensor of claim 1, wherein the electrical circuit further comprises:
   a magnetic field detecting circuit configured to detect an external magnetic field and output the magnetic induction signal that is indicative of at least one characteristic of the external magnetic field.

3. The magnetic sensor of claim 2, wherein the magnetic field detecting circuit comprises:
   a magnetic sensing element configured to detect the external magnetic field and output an analog electric signal that corresponds to the external magnetic field;
   a signal processing element configured to amplify the analog electric signal, remove interference therefrom, and generate a processed analog electric signal; and
   an analog-digital conversion element configured to convert the processed analog electric signal to the magnetic induction signal, which corresponds to a switching digital signal.

4. The magnetic sensor of claim 1, wherein, when the predetermined condition is satisfied, the magnetic sensor operates alternately between the first and the second state, depending on a magnetic polarity of the external magnetic field and a polarity of the external AC power supply.

5. The magnetic sensor of claim 4, wherein the output control circuit is configured to control the magnetic sensor, when the predetermined condition is satisfied, to operate
- in the first state by allowing a load current to flow in the first direction when the magnetic induction signal indicates that the external magnetic field has a first magnetic polarity and the external AC power supply has a first polarity; and
- in the second state by allowing a load current to flow in the second direction when the magnetic induction signal indicates that the external magnetic field has a second magnetic polarity opposite to the first magnetic polarity and the external AC power supply has a second polarity opposite to the first polarity.

6. The magnetic sensor of claim 1, wherein the output control circuit comprises
- a first switch coupled with the output port to form a first current path for a load current to flow in the first direction; and
- a second switch coupled with the output port to form a second current path for a load current to flow in the second direction, wherein
- the first and second switches respond respectively to the magnetic induction signal to selectively turn on the first and second current paths, respectively.

7. The magnetic sensor of claim 1, wherein when the magnetic sensor operates in either the first or the second state, the operating frequency of the magnetic sensor is the same as the frequency of the external AC power supply.

8. The magnetic sensor of claim 1, wherein the output control circuit is further configured to control, when the predetermined condition is not satisfied, the magnetic sensor to operate in a third state, in which there is no or a negligible amount of load current flowing through the output port.

9. The magnetic sensor of claim 8, wherein the operating frequency of the magnetic sensor in the third state is twice of the frequency of the external AC power supply.

10. The magnetic sensor of claim 1, wherein the electrical circuit further comprises a rectifier configured to rectify in full wave the external AC power supply to generate an output voltage having a frequency twice of the operating frequency of the magnetic sensor in the first or the second state.

11. A magnetic sensor, comprising
a housing;
an input port extending from the housing and coupled with an external alternating current (AC) power supply;
an output port extending from the housing; and
an electrical circuit which comprises:
- an output control circuit coupled with the output port and configured to be at least responsive to a magnetic induction signal, the external AC power supply and, when a predetermined condition is satisfied, to control the magnetic sensor to operate in a first state in which a load current flows through the output port and a second state in which the load current flows to the magnetic sensor from the output port, the predetermined condition being set as a predetermined period that a voltage of the magnetic sensor reaches a predetermined voltage threshold, the output control circuit comprising:
  - a sub-circuit configured to determine whether the predetermined condition is satisfied, the sub-circuit further comprising:
    - a voltage detecting circuit configured to detect a specific voltage and, when the specific voltage equals to or is greater than a predetermined voltage threshold, output a triggering signal;
    - a delay circuit coupled with the voltage detecting circuit and configured to time, upon receiving the triggering signal, a length of time during which the specific voltage equals to or is greater than the predetermined voltage threshold; and
    - a logic circuit coupled with the delay circuit and configured to:
      - signal that the predetermined condition is satisfied, when the length of time exceeds a predetermined length of time, and
      - signal that the predetermined condition is not satisfied, when the length of time does not exceed the predetermined length of time, wherein
the magnetic induction signal is indicative of at least one characteristic of an external magnetic field detected by the electrical circuit, and
the operating frequency of the magnetic sensor is positively proportional to the frequency of the external AC power supply.

* * * * *